US012696393B2

(12) United States Patent
Yang et al.

(10) Patent No.: US 12,696,393 B2
(45) Date of Patent: Jul. 28, 2026

(54) CIRCUIT BOARD ASSEMBLY, MANUFACTURING METHOD, AND ELECTRONIC DEVICE

(71) Applicant: HONOR DEVICE CO., LTD., Shenzhen (CN)

(72) Inventors: Fan Yang, Shenzhen (CN); Jianqiang Guo, Shenzhen (CN); Mingchuan Li, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 222 days.

(21) Appl. No.: 18/022,376

(22) PCT Filed: Aug. 22, 2022

(86) PCT No.: PCT/CN2022/113839
§ 371 (c)(1),
(2) Date: Feb. 21, 2023

(87) PCT Pub. No.: WO2023/056787
PCT Pub. Date: Apr. 13, 2023

(65) Prior Publication Data
US 2024/0179845 A1 May 30, 2024

(30) Foreign Application Priority Data
Oct. 9, 2021 (CN) .......................... 202111176992.X

(51) Int. Cl.
H05K 1/14 (2006.01)
H05K 1/02 (2006.01)
H05K 3/36 (2006.01)

(52) U.S. Cl.
CPC ............. *H05K 1/147* (2013.01); *H05K 1/028* (2013.01); *H05K 3/361* (2013.01); *H05K 2201/09845* (2013.01); *H05K 2203/04* (2013.01)

(58) Field of Classification Search
CPC .......... H05K 2201/09845; H05K 2201/09572; H05K 3/42; H05K 3/363; H05K 3/3468; H05K 1/147; H05K 1/028
(Continued)

(56) References Cited

U.S. PATENT DOCUMENTS 3,888,639 A * 6/1975 Hastings ................ H05K 3/363
361/779
5,014,162 A 5/1991 Clark et al.
(Continued)

FOREIGN PATENT DOCUMENTS

CN 105023896 A 11/2015
CN 207070451 U 3/2018
(Continued)

*Primary Examiner* — Paresh Paghadal
(74) *Attorney, Agent, or Firm* — WOMBLE BOND DICKINSON (US) LLP

(57) ABSTRACT

A circuit board assembly, a manufacturing method are provided. The circuit board assembly includes a flexible printed circuit board and a printed circuit board, a pad for disposing a welding piece is provided on the printed circuit board, the flexible printed circuit board includes a main body and a welding part disposed on an inner wall of a through hole of the main body, the through hole includes a recessing part and a connection segment connected to a bottom wall of the recessing part, the recessing part is disposed on a side that is of the connection segment and that is away from the pad, and an end that is of the connection segment and that is away from the recessing part faces the pad, so that the
(Continued)

welding piece overflows into the recessing part through the connection segment, and welds the welding part to the pad.

19 Claims, 14 Drawing Sheets

(58) Field of Classification Search
USPC ......................................................... 174/266
See application file for complete search history.

(56) References Cited

U.S. PATENT DOCUMENTS

| | | | | | |
|---|---|---|---|---|---|
| 5,688,584 | A | * | 11/1997 | Casson | H05K 3/462 |
| | | | | | 428/209 |
| 5,783,865 | A | * | 7/1998 | Higashiguchi | H01L 24/97 |
| | | | | | 257/E21.511 |
| 6,181,219 | B1 | * | 1/2001 | Gailus | H05K 1/024 |
| | | | | | 174/262 |
| 2004/0118605 | A1 | * | 6/2004 | van der Laan | H05K 3/429 |
| | | | | | 174/262 |
| 2004/0211594 | A1 | * | 10/2004 | Ho | H05K 3/4007 |
| | | | | | 174/257 |
| 2005/0128672 | A1 | * | 6/2005 | Tourne | H05K 3/0047 |
| | | | | | 29/830 |
| 2008/0160252 | A1 | * | 7/2008 | Leon | H05K 3/429 |
| | | | | | 428/131 |
| 2009/0194322 | A1 | * | 8/2009 | Usui | H05K 1/115 |
| | | | | | 174/262 |
| 2010/0085717 | A1 | * | 4/2010 | Sweeney | H05K 3/3447 |
| | | | | | 29/846 |
| 2010/0319979 | A1 | * | 12/2010 | Hsu | H05K 1/0251 |
| | | | | | 174/262 |
| 2011/0037531 | A1 | * | 2/2011 | Hasselblad | H01P 1/025 |
| | | | | | 333/26 |
| 2011/0088929 | A1 | * | 4/2011 | Yang | H05K 3/4007 |
| | | | | | 174/262 |
| 2011/0121427 | A1 | * | 5/2011 | Stupar | H01L 21/76898 |
| | | | | | 257/532 |
| 2013/0161085 | A1 | * | 6/2013 | Oh | H01L 23/49811 |
| | | | | | 174/267 |
| 2014/0048310 | A1 | | 2/2014 | Montevirgen et al. | |
| 2015/0008029 | A1 | * | 1/2015 | Lee | H05K 3/429 |
| | | | | | 174/266 |
| 2016/0150653 | A1 | * | 5/2016 | Chen | H05K 3/0094 |
| | | | | | 174/266 |
| 2016/0174375 | A1 | * | 6/2016 | Mizushima | H01L 24/83 |
| | | | | | 29/829 |
| 2021/0360795 | A1 | * | 11/2021 | Schlaffer | H05K 3/3431 |

FOREIGN PATENT DOCUMENTS

| | | | |
|---|---|---|---|
| CN | 107197600 | B | 5/2019 |
| CN | 110913097 | A | 3/2020 |
| CN | 113038703 | A | 6/2021 |
| CN | 113473703 | A | 10/2021 |
| EP | 3819988 | A1 | 5/2021 |
| JP | H09199861 | A | 7/1997 |
| JP | H11121648 | A | 4/1999 |
| JP | 2001085835 | A | 3/2001 |
| JP | 2002289745 | A | 10/2002 |

* cited by examiner

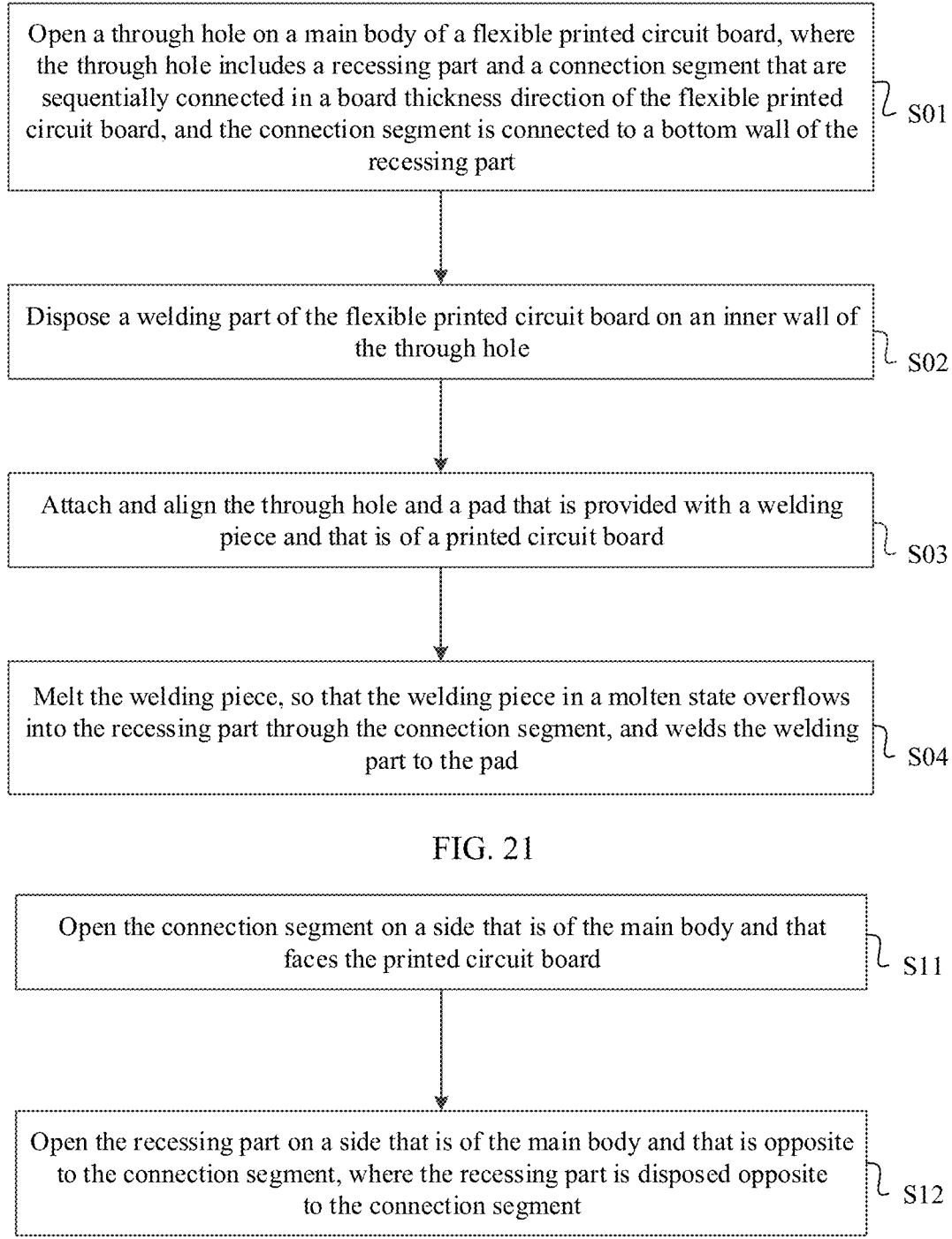

Open a through hole on a main body of a flexible printed circuit board, where the through hole includes a recessing part and a connection segment that are sequentially connected in a board thickness direction of the flexible printed circuit board, and the connection segment is connected to a bottom wall of the recessing part ⌐ S01

Dispose a welding part of the flexible printed circuit board on an inner wall of the through hole ⌐ S02

Attach and align the through hole and a pad that is provided with a welding piece and that is of a printed circuit board ⌐ S03

Melt the welding piece, so that the welding piece in a molten state overflows into the recessing part through the connection segment, and welds the welding part to the pad ⌐ S04

FIG. 21

Open the connection segment on a side that is of the main body and that faces the printed circuit board ⌐ S11

Open the recessing part on a side that is of the main body and that is opposite to the connection segment, where the recessing part is disposed opposite to the connection segment ⌐ S12

CIRCUIT BOARD ASSEMBLY, MANUFACTURING METHOD, AND ELECTRONIC DEVICE

CROSS-REFERENCE TO RELATED APPLICATIONS

This application is a national stage of International Application No. PCT/CN2022/113839, filed on Aug. 22, 2022, which claims priority to Chinese Patent application Ser. No. 202111176992.X, filed on Oct. 9, 2021. The disclosures of both of the aforementioned applications are hereby incorporated by reference in their entireties.

TECHNICAL FIELD

This application relates to the field of electronic technologies, and in particular, to a circuit board assembly, a manufacturing method, and an electronic device.

BACKGROUND

With continuous development of science and technology, a requirement of a user for an electronic device continuously develops towards a requirement for lightening and thinning and miniaturization.

To meet the requirement of the user for lightening and thinning and miniaturization of the electronic device, in the electronic device, when a flexible printed circuit board and a printed circuit board are connected, an FPC on Board welding process is gradually used to replace a manner in the conventional technology in which a board-to-board (Board To Board, BTB) connector is used for connection, so as to meet a development trend of lightening and thinning of the electronic device, such as a mobile phone or a watch. Currently, in the FPC on Board welding process, a tin penetration hole is usually disposed at a position that is at the flexible printed circuit board and that corresponds to a pad of the printed circuit board. On the one hand, tin penetration can be performed in a process of welding by using the tin penetration hole, which improves welding strength of a welding joint between the flexible printed circuit board and the printed circuit board: on the other hand, a welding state of the flexible printed circuit board and the printed circuit board can be determined by determining whether tin exposure occurs on the tin penetration hole.

However, when the flexible printed circuit board is of a multi-layer structure or when a flexible printed circuit board with liquid crystal polymer (Liquid Crystal Polymer, LCP) is used in the electronic device, a welding state misjudgment frequently occurs. Consequently, there is a risk of poor welding between the flexible printed circuit board and the printed circuit board.

SUMMARY

This application provides a circuit board assembly, a manufacturing method, and an electronic device, so that welding quality of a flexible printed circuit board and a printed circuit board can be easily determined, and welding difficulty and a risk of poor welding of the flexible printed circuit board and the printed circuit board can be reduced.

A first aspect of embodiments of this application provides a circuit board assembly. The circuit board assembly includes a flexible printed circuit board and a printed circuit board, a pad for disposing a welding piece is provided on the printed circuit board, the flexible printed circuit board includes a main body and a welding part, a through hole that connects board surfaces of the flexible printed circuit board is provided on the main body, and the welding part is disposed on an inner wall of the through hole. The through hole includes a recessing part and a connection segment that are sequentially connected in a board thickness direction of the flexible printed circuit board, the recessing part is disposed on a side that is of the connection segment and that is away from the pad, and the connection segment is connected to a bottom wall of the recessing part.

An end that is of the connection segment and that is away from the recessing part faces the pad, so that the welding piece welded to the pad overflows into the recessing part through the connection segment, and welds the welding part to the pad.

In this embodiment of this application, the through hole including the recessing part is disposed on the flexible printed circuit board, the recessing part and the connection segment that are of the through hole are sequentially connected in a board thickness direction of the flexible printed circuit board, and the recessing part is disposed on a side that is of the connection segment and that is away from the pad of the printed circuit board. When an end that is of the connection segment and that is away from the recessing part faces the pad, the welding piece in a molten state on the pad overflows into the recessing part through the connection segment, and welds the welding part to the pad. In this way, on the basis that welding strength of the flexible printed circuit board and the printed circuit board is improved, welding quality of the flexible printed circuit board and the printed circuit board can be easily determined, and accuracy of a welding detection result of the circuit board assembly can be improved: in addition, a path of exposure of the welding piece on the flexible printed circuit board can be shortened, and welding difficulty and a risk of poor welding of the flexible printed circuit board and the printed circuit board can be reduced.

In an optional implementation, a side that is of the recessing part and that is away from the connection segment is an open end, and a radial dimension of an open edge of the recessing part is greater than an inner diameter of the connection segment.

In this way, the open end is disposed to reduce overflowing of the welding piece in a molten state on the pad into the recessing part through the connection segment. In addition, because the radial dimension of the open edge of the recessing part is greater than the inner diameter of the connection segment, welding quality of the flexible printed circuit board and the printed circuit board can be easily determined, and accuracy of a welding detection result of the circuit board assembly can be improved: in addition, a path of exposure of the welding piece on the flexible printed circuit board can be shortened, and welding difficulty and a risk of poor welding of the flexible printed circuit board and the printed circuit board can be reduced.

In an optional implementation, at least a part of an inner wall of the recessing part forms an exposure surface to expose the welding piece, and the exposure surface is disposed on an outer side of a peripheral edge of an end of the connection segment.

In this way, the welding piece in a molten state only needs to climb out of the connection segment to overflow to the exposure surface, so that welding quality of the flexible printed circuit board and the printed circuit board can be determined, a misjudgment of poor welding of the flexible printed circuit board and the printed circuit board can be effectively reduced, accuracy of a welding detection result of the circuit board assembly can be improved, welding difficulty of the flexible printed circuit board and the printed circuit board can be reduced, and a total thickness of the circuit board assembly can be reduced.

In an optional implementation, the exposure surface is parallel to a board surface of the flexible printed circuit board: or the exposure surface is obliquely disposed on a board surface of the flexible printed circuit board.

In this way, accuracy of a welding detection result of the circuit board assembly can be improved, a path of exposure of the welding piece on the flexible printed circuit board is shortened, and structures of the through hole and the flexible printed circuit board can be more diversified.

In an optional implementation, the through hole is a stepped hole, an end of a larger diameter of the stepped hole forms the recessing part, an end of a smaller diameter of the stepped hole forms the connection segment, and a stepped surface of the stepped hole forms the exposure surface.

In this way, the stepped hole is disposed, so that on the one hand, a path of exposure of the welding piece on the flexible printed circuit board can be shortened, and accuracy of a welding detection result of the circuit board assembly can be improved: on the other hand, a welding joint of the circuit board assembly can be improved.

In an optional implementation, the welding piece in a molten state may overflow into the recessing part through the connection segment and the exposure surface: and an overflow height of the welding piece in the recessing part is greater than or equal to half of a recessing depth of the recessing part.

In this way, strength of the welding joint in the circuit board assembly is can be improved.

In an optional implementation, a minimum radial dimension of the recessing part is greater than or equal to twice an inner diameter of the connection segment.

In this way, a path of exposure of the welding piece on the flexible printed circuit board can be shortened as much as possible. On the one hand, welding quality of the flexible printed circuit board and the printed circuit board can be easily determined: on the other hand, air bubbles in the welding piece can easily escape through the through hole, and welding quality of the flexible printed circuit board and the printed circuit board is further improved.

In an optional implementation, a distance between a circumferential edge of the recessing part and an edge of the pad is less than or equal to 0.05 mm.

In this way, a specific one-side margin can be reserved between the through hole and the welding part, thereby ensuring completeness of the through hole in the welding part.

In an optional implementation, the recessing part has a same radial dimension in a board thickness direction perpendicular to the flexible printed circuit board, or the recessing part has different radial dimensions.

In this way, accuracy of a welding detection result of the circuit board assembly can be improved, and structures of the through hole and the flexible printed circuit board can be more diversified.

In an optional implementation, the recessing part and the connection segment are coaxially disposed.

In this way, on the one hand, the welding piece in a molten state can directly overflow into the recessing part through the connection segment: on the other hand, opening of the through hole is facilitated.

In an optional implementation, the welding part is attached to the inner wall of the through hole.

In this way, the welding part can weld the flexible printed circuit board to the printed circuit board by using the welding piece, to form the circuit board assembly.

In an optional implementation, two ends of the welding part extend outward in opposite directions along the inner wall of the through hole, and an end of the welding part extends to a board surface of the main body.

In this way, a contact area between the welding part and the main body can be increased, thereby improving strength of the welding joint of the circuit board assembly.

In an optional implementation, the welding part is a copper welding layer or a copper alloy welding layer.

In this way, properties of copper or a copper alloy are utilized to implement welding of the flexible printed circuit board to the printed circuit board, and lightening and thinning of the circuit board assembly are facilitated.

In an optional implementation, the welding piece is solder paste.

In this way, the solder paste may be heated to a molten state, so that the welding part is welded to the pad, thereby implementing welding of the flexible printed circuit board to the printed circuit board.

A second aspect of embodiments of this application provides a method for manufacturing a circuit board assembly. The manufacturing method is applied to the circuit board assembly according to any one of the foregoing implementations, and the manufacturing method includes:

opening a through hole on a main body of a flexible printed circuit board, where the through hole includes a recessing part and a connection segment that are sequentially connected in a board thickness direction of the flexible printed circuit board, and the connection segment is connected to a bottom wall of the recessing part;

disposing a welding part of the flexible printed circuit board on an inner wall of the through hole;

attaching and aligning the through hole and a pad that is provided with a welding piece and that is of a printed circuit board: and melting the welding piece, so that the welding piece in a molten state overflows into the recessing part through the connection segment, and welds the welding part to the pad.

In this way, the through hole including the recessing part and the connection segment is disposed on the flexible printed circuit board. On the basis that welding strength of the flexible printed circuit board and the printed circuit board is improved, on the one hand, accuracy of a welding detection result of the circuit board assembly can be improved: on the other hand, welding difficulty and a risk of poor welding of the flexible printed circuit board and the printed circuit board are reduced, and lightening and thinning of the circuit board assembly are facilitated.

In an optional implementation, the opening a through hole on a main body of a flexible printed circuit board specifically includes:

opening the connection segment on a side that is of the main body and that faces the printed circuit board; and opening the recessing part on a side that is of the main body and that is opposite to the connection segment, where the recessing part is disposed opposite to the connection segment.

In this way, formation of the through hole on the flexible printed circuit board is facilitated, and a process of opening the through hole on the flexible printed circuit board can be simplified.

In an optional implementation, the opening a through hole on a main body of a flexible printed circuit board specifically includes:

opening the connection segment in a board thickness direction of one of a first main body layer and a second main body layer, and opening the recessing part in a board thickness direction of the other layer, where the recessing part is disposed opposite to the connection segment: and press-fitting the first main body layer and the second main body layer to form the main body.

In this way, formation of the through hole on the flexible printed circuit board is facilitated, and difficulty of opening the through hole on the flexible printed circuit board can be reduced.

A third aspect of embodiments of this application provides an electronic device, where the electronic device includes the circuit board assembly according to any one of the foregoing implementations.

In this way, an electrical connection between the flexible printed circuit board and the printed circuit board in the electronic device is implemented, a path of exposure of the welding piece on the flexible printed circuit board can be shortened, welding difficulty and a risk of poor welding of the flexible printed circuit board and the printed circuit board can be reduced, and lightening and thinning of the electronic device are facilitated while stability of the circuit board assembly is ensured.

BRIEF DESCRIPTION OF DRAWINGS

FIG. 11 is an enlarged schematic view of Part B of the flexible printed circuit board in

FIG. 10:

FIG. 21 is a schematic flowchart of a method for manufacturing a circuit board assembly according to an embodiment of this application:

FIG. 22 is a schematic flowchart of a method for opening a through hole on a flexible printed circuit board according to an embodiment of this application.

DESCRIPTION OF REFERENCE NUMERALS

100—Mobile phone; 10—Display; 20—Middle frame; 30—Rear housing; 40—Printed circuit board; 41—First welding area; 411—Pad; 42—Electronic component; 43—Metal conducting wire;

50—Flexible printed circuit board; 51—Main body; 511—Flexible dielectric layer; 512—Metal wire; 513—Second welding area; 514—First main body layer; 515—Second main body layer; 516—Through hole; 5161—Connection segment; 5162—Recessing part; 5163—Open end; 5164—Exposure surface; 52—Welding part; 53—Tin penetration hole;

60—Welding piece; 61—Solder paste; 62—Fracture part; 70—Welding joint; 80—Soldering flux layer: and 90—Glass cover plate.

DESCRIPTION OF EMBODIMENTS

Currently, a printed circuit board (Printed Circuit Board, PCB) and a flexible printed circuit (Flexible Printed Circuit, FPC) board are usually disposed in an electronic device. In some cases, an electrical connection is required between the printed circuit board and the FPC, so that two different printed circuit boards in the electronic device are connected by using the FPC, or a function module in the electronic device is electrically connected to an electronic component on the printed circuit board by using the FPC.

In the conventional technology, the printed circuit board and the flexible printed circuit board may be connected by using a board-to-board (Board To Board, BTB) connector. Specifically, the printed circuit board and the flexible printed circuit board may be separately connected to one BTB connector, to implement an electrical connection between the printed circuit board and the flexible printed circuit board through mutual plugging between two BTB connectors. Because a volume of the BTB connector is large, the BTB connector needs to occupy relatively large installation space in the electronic device. This is not conducive to lightening and thinning and miniaturization of the electronic device.

Compared with the BTB connector, in an FPC on Board (FPC on Board, FoB) welding process, a height of a position (that is, a welding joint) at which the printed circuit board and the flexible printed circuit board are connected is relatively low. In this way, occupied space in a vertical direction (that is, a thickness direction of the electronic device) of the electronic device can be reduced, so as to meet a development trend of lightening and thinning of the electronic device such as a watch, a foldable phone, or another foldable device. Therefore, to meet a requirement of a user for lightening and thinning and miniaturization of the electronic device, in the electronic device, the FoB welding process is gradually used to replace the BTB connector, to implement an electrical connection between the printed circuit board and the flexible printed circuit board.

Figure 1:
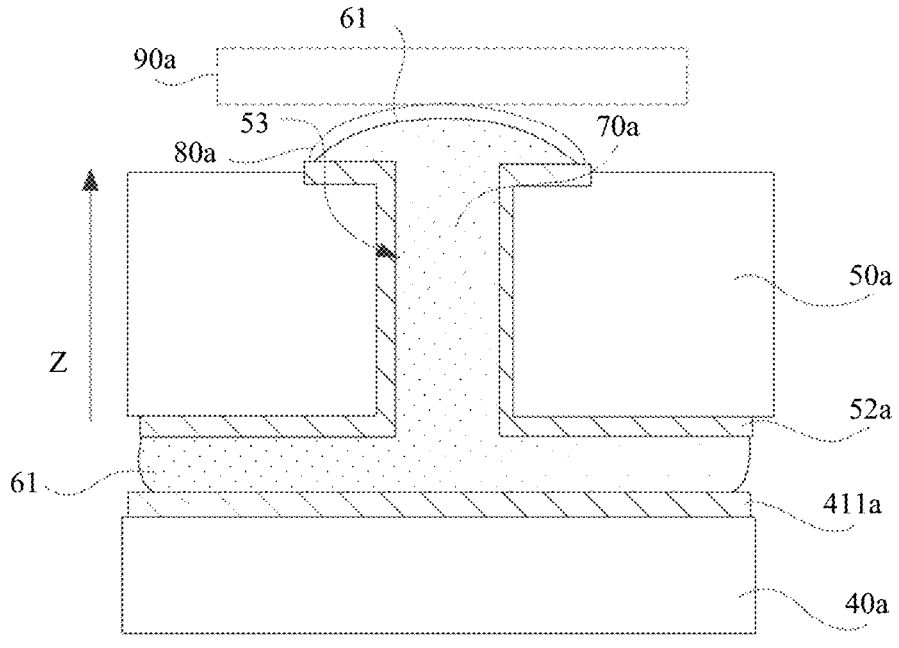
FIG. 1 is a schematic diagram of a structure of a circuit board assembly according to a related technology.

Currently: in the FoB welding process, as shown in FIG. 1, a tin penetration hole 53 is usually disposed on a flexible printed circuit board 50a. When the tin penetration hole 53 of the flexible printed circuit board 50a is connected to a pad 411a that is provided with a solder paste 61 and that is on a printed circuit board 40a, the solder paste 61 in a molten state climbs up along the tin penetration hole 53 and out of the tin penetration hole 53, and is exposed (that is, tin exposure) on a side that is of the flexible printed circuit board 50a and that is away from the printed circuit board 40a, so that it is determined that welding of the tin penetration hole 53 of the flexible printed circuit board 50a to the pad 411a is good. After the solder paste 61 is solidified, the solder paste 61 forms a welding joint 70a shown in FIG. 1, so that a welding part 52a on the flexible printed circuit board 50a is connected to the corresponding pad 411a of the printed circuit board 40a by using the welding joint 70a, and conduction is implemented. In this way, by disposing the tin penetration hole 53 on the flexible printed circuit board 50a, on the one hand, tin climbing (that is, tin climbing in a Z direction in FIG. 1) of the solder paste 61 in the tin penetration hole 53 in an extension direction of the tin penetration hole 53 can be increased in a process of welding, thereby improving welding strength of the welding joint 70a between the flexible printed circuit board 50a and the printed circuit board 40a: on the other hand, a welding state of the flexible printed circuit board 50a and the printed circuit board 40a can be determined by determining whether tin exposure occurs on the tin penetration hole 53, so as to determine whether the welding joint 70a between the flexible printed circuit board 50a and the printed circuit board 40a is in a good welding state.

However, when the flexible printed circuit board 50a is of a multi-layer structure, or when a flexible printed circuit board 50a with liquid crystal polymer (Liquid Crystal Polymer. LCP) is used in the electronic device, a total thickness of the flexible printed circuit board 50a increases in comparison with that of a single-layer structure of the flexible printed circuit board 50a. For example, the total thickness of the flexible printed circuit board 50a may reach 0.1 mm to 0.5 mm or more. In this way, a tin penetration path of the solder paste 61 on the flexible printed circuit board 50a is relatively long. When a volume of the solder paste 61 remains unchanged, a probability that the solder paste 61 in a molten state fails to climb out of the tin penetration hole 53 increases.

Figure 2:
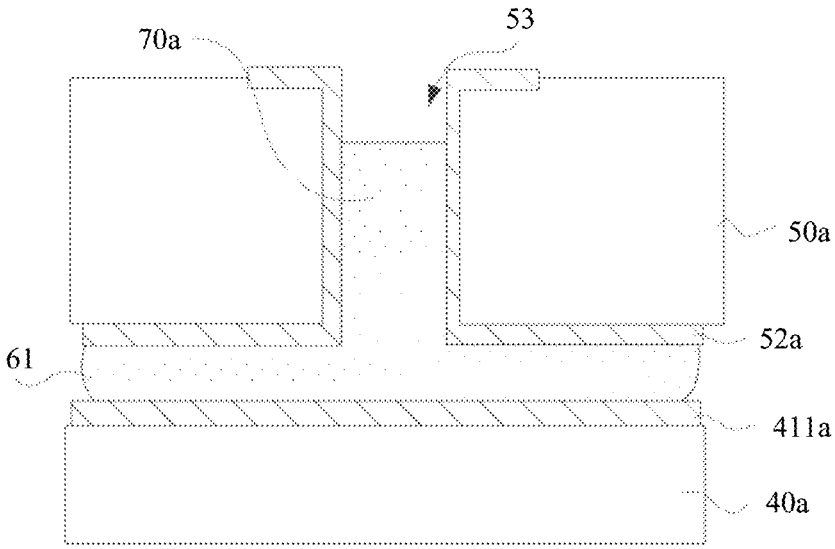
FIG. 2 is a schematic diagram of a structure of poor tin penetration of a circuit board assembly according to a related technology.

As shown in FIG. 2, when a welding state of the welding joint 70a between the flexible printed circuit board 50a and the printed circuit board 40a is detected by an existing detection mechanism for detecting solder paste, a misjudgment of poor welding (that is, a poorly welded product) occurs usually because of the solder paste 61 fails to climb out of the tin hole 53 (that is, no tin exposure), and the detection mechanism cannot perform a visual inspection of a height of the welding joint 70a in a poorly welded product. Consequently, there is a risk of poor tin penetration and poor welding in the flexible printed circuit board 50a.

In view of this, embodiments of this application provide a circuit board assembly, a manufacturing method, and an electronic device. A through hole is disposed on a flexible printed circuit board of the circuit board assembly, the through hole includes a connection segment and a recessing part that are sequentially connected in a board thickness direction of the flexible printed circuit board, and the recessing part is disposed on a side that is of the connection segment and that is away from a pad of a printed circuit board. In this way, when an end that is of the connection segment and that is away from the recessing part faces a pad provided with a welding piece and is press-fitted to the pad, the welding piece in a molten state overflows into the recessing part through the connection segment, so that the welding part is welded to the pad. In the embodiments of this application, while welding strength of the flexible printed circuit board and the printed circuit board can be improved, welding quality of the flexible printed circuit board and the printed circuit board can be easily determined, and accuracy of a welding detection result of the circuit board assembly can be improved: in addition, a path of exposure of the welding piece on the flexible printed circuit board can be shortened, and welding difficulty and a risk of poor welding of the flexible printed circuit board and the printed circuit board can be reduced.

The electronic device may include, but is not limited to, an electronic device in which an electrical connection exists between the flexible printed circuit board and the printed circuit board, such as a mobile phone, a tablet computer (that is, a pad), a notebook computer, an ultra-mobile personal computer (ultra-mobile personal computer. UMPC), a handheld computer, a watch, a wristband, a game console, a walkie-talkie, a handheld terminal, a netbook, a POS machine, and a personal digital assistant (personal digital assistant. PDA).

The following further describes an electronic device in embodiments of this application by using a mobile phone as an example.

Figure 3:
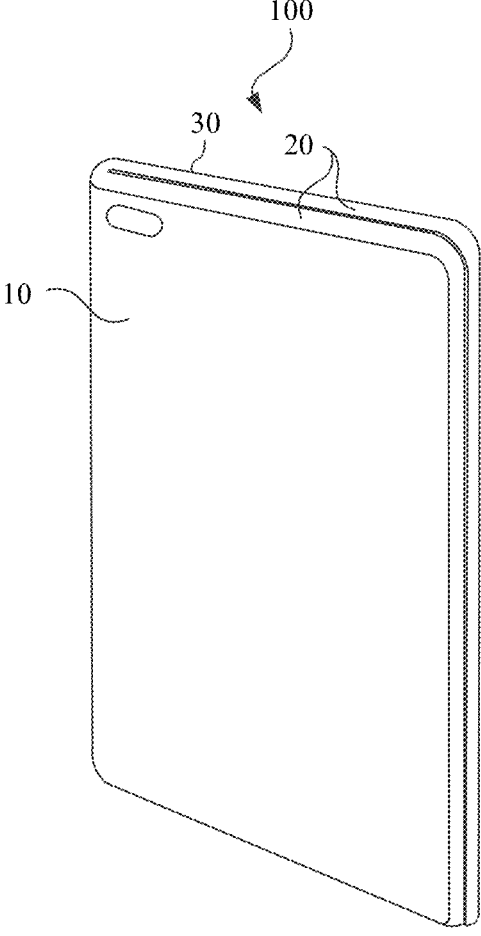
FIG. 3 is a schematic diagram of a structure of a mobile phone according to an embodiment of this application.
Figure 4:
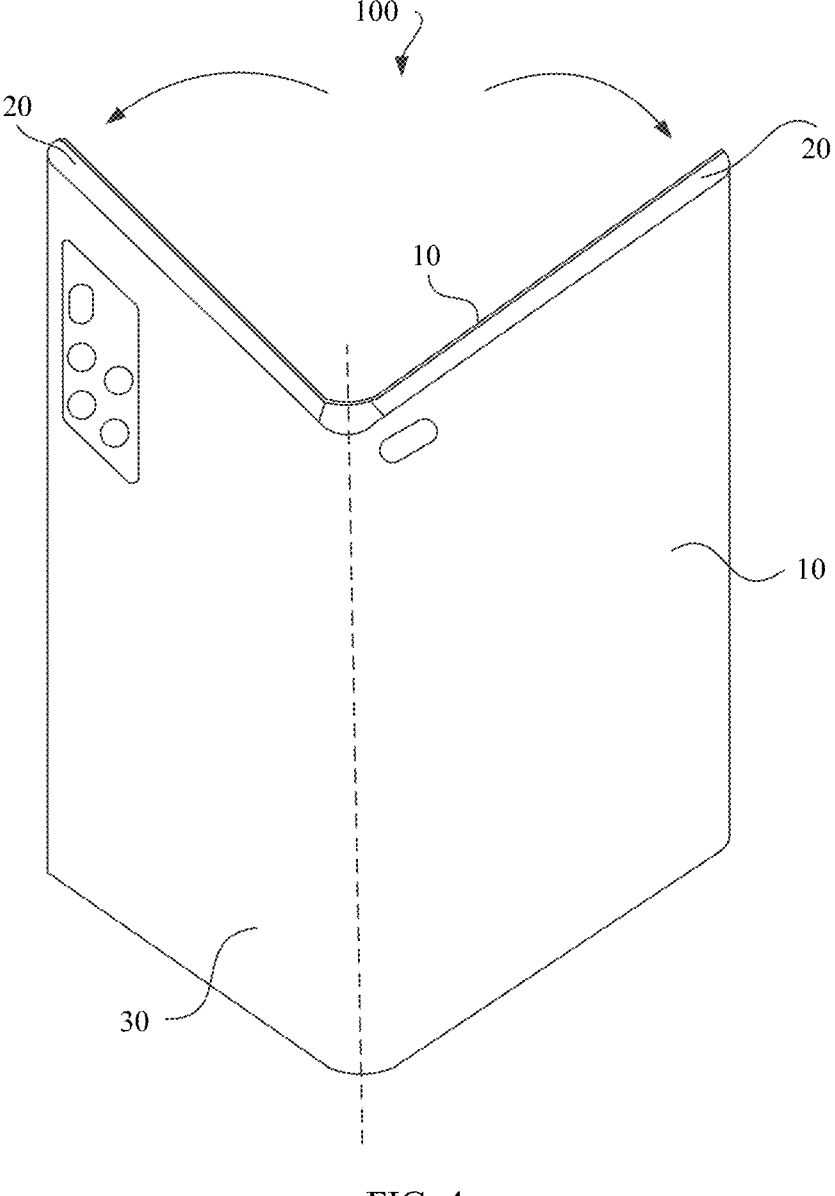
FIG. 4 is a schematic diagram of an opening process of a display of a mobile phone according to an embodiment of this application.
Figure 5:
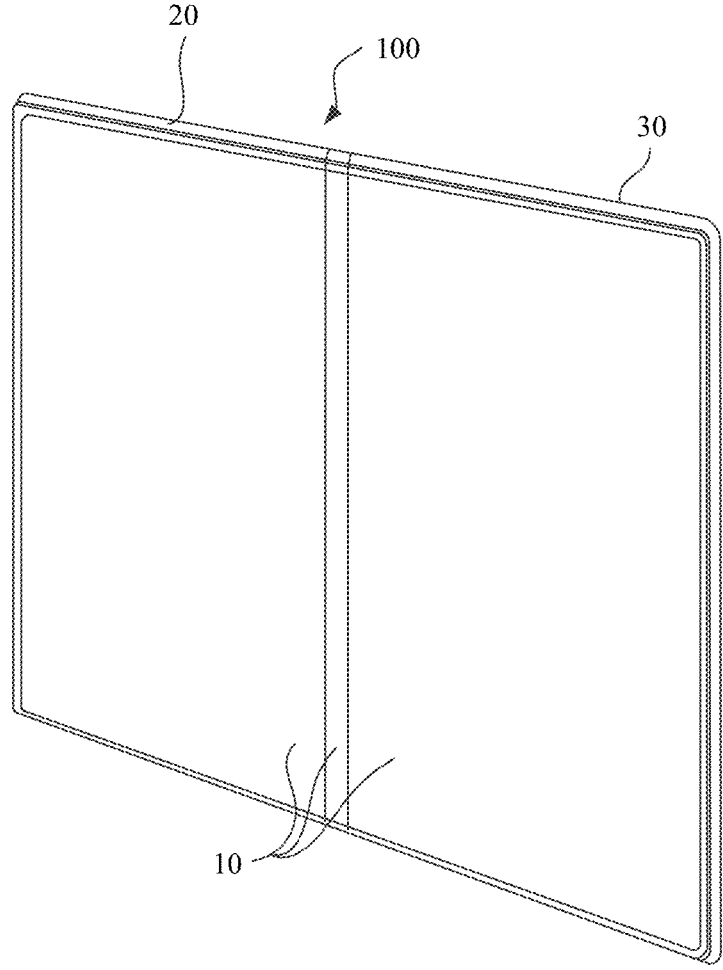
FIG. 5 is a schematic diagram of a structure in which a display of a mobile phone is fully unfolded according to an embodiment of this application.
Figure 6:
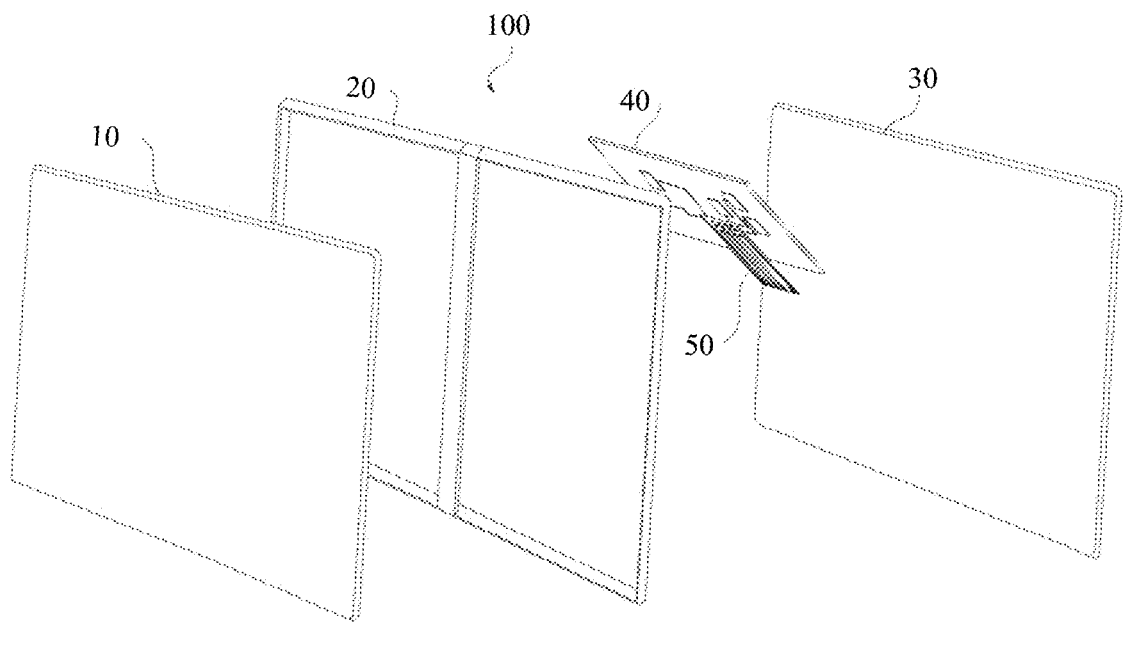
FIG. 6 is a schematic exploded view of a mobile phone according to an embodiment of this application.

FIG. 3 to FIG. 5 separately show schematic diagrams of structures of an electronic device such as a mobile phone 100 in different use states. In FIG. 3, the mobile phone is in a folded state. Referring to FIG. 6, the electronic device such as the mobile phone 100 may include a middle frame 20, a display 10, and a rear housing 30. The display 10 and the rear housing 30 are assembled on two opposite sides of the middle frame 20. When the middle frame of the mobile phone can rotate along a direction indicated by an arrow in FIG. 4, the mobile phone is unfolded to a state shown in FIG. 8. In this way, although a user may obtain a relatively good visual experience, an overall thickness of the mobile phone after being folded is relatively large.

FIG. 6 is a schematic exploded view of a mobile phone according to an embodiment of this application. It may be learned from FIG. 6 that the electronic device such as the mobile phone 100 may further include a circuit board assembly. An embodiment of this application provides a circuit board assembly, where the circuit board assembly may include a flexible printed circuit board 50 and a printed circuit board 40. The circuit board assembly may be disposed in space formed between the middle frame 20 and the rear housing 30, and is disposed on an inner side of the display 10.

Figure 7:
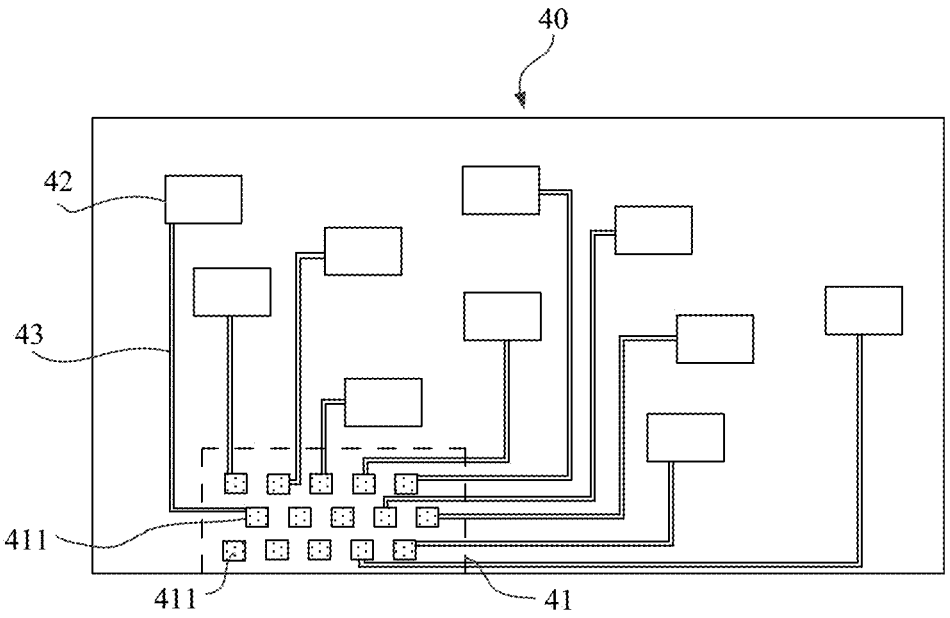
FIG. 7 is a schematic diagram of a structure of a printed circuit board according to an embodiment of this application.

FIG. 7 is a schematic diagram of a structure of a printed circuit board according to an embodiment of this application. Referring to FIG. 7, an electronic component 42 and a first welding area 41 are disposed on a printed circuit board. The first welding area 41 is located on an edge of the printed circuit board 40, to facilitate welding of the printed circuit board 40 to the flexible printed circuit board 50. There are a plurality of pads 411 in the first welding area 41. Each pad 411 is electrically connected to the electronic component 42 by using a metal conducting wire 43 on the printed circuit board 40.

The printed circuit board 40 may be a radio frequency (radio frequency. RF) board or an application processor (application processor. AP) board. The radio frequency board may be used for, but is not limited to, carrying a radio frequency integrated circuit (radio frequency integrated circuit. RFIC), a radio frequency power amplifier (radio frequency power amplifier. RFPA), a wireless fidelity (wireless fidelity. WIFI) chip, and the like. The application processor board may be used for, but is not limited to, carrying a system on chip (system on chip. SOC) component, a double data rate (double data rate. DDR) memory, a power management chip, and the like.

The flexible printed circuit board 50 is electrically connected to the printed circuit board 40, and may be configured to connect a function module in the electronic device and an electronic component 42 corresponding to the function module on the printed circuit board 40. The function module may include, but is not limited to, the display 10, a camera module, a battery module, and the like in the electronic device. For example, the flexible printed circuit board 50 may be connected to the camera module and a graphics processing chip on the printed circuit board 40. Alternatively, the flexible printed circuit board 50 may be connected to the display 10 and a display and operation chip on the printed circuit board 40.

Figure 8:
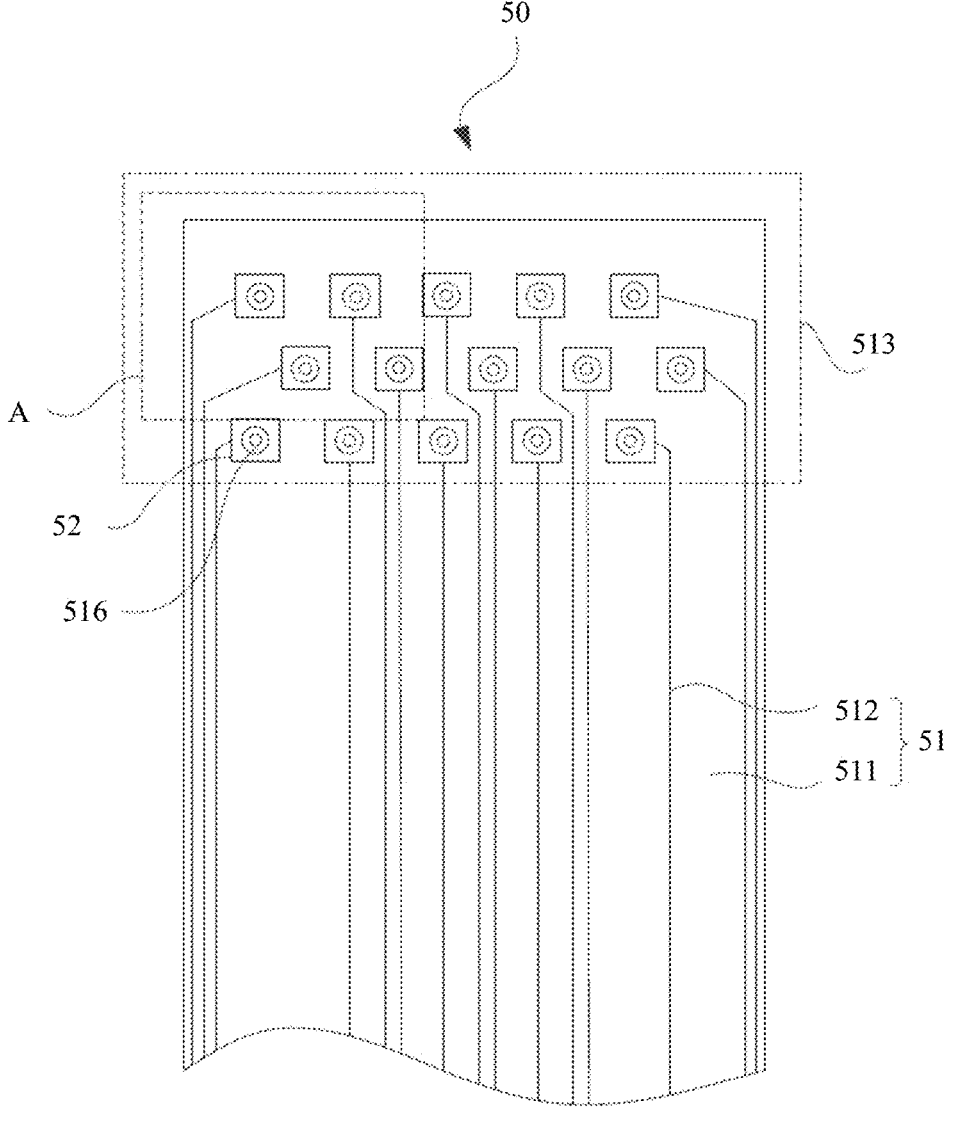
FIG. 8 is a schematic diagram of a structure of a flexible printed circuit board according to an embodiment of this application.
Figure 9:
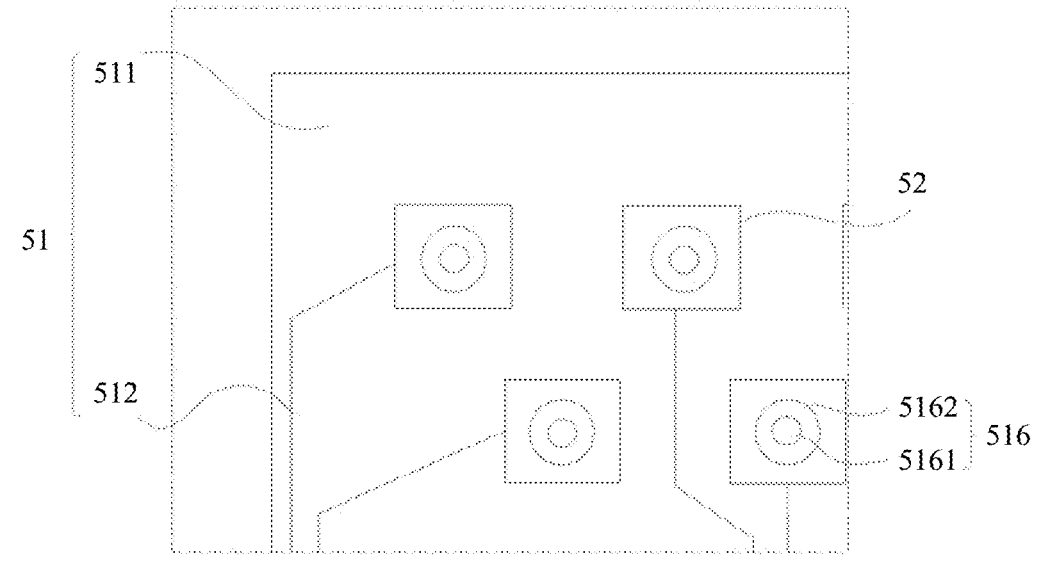
FIG. 9 is an enlarged schematic view of Part A of the flexible printed circuit board in FIG. 8.

FIG. 8 and FIG. 9) are schematic diagrams of an overall structure and a partial structure of a flexible printed circuit board according to an embodiment of this application. It may be learned from FIG. 8 that the flexible printed circuit board 50 may include a main body 51 and a welding part 52. The main body 51 may include, but is not limited to, a flexible dielectric layer 511 and a plurality of metal wires 512 disposed on the flexible dielectric layer 511. A second welding area 513 is disposed in an edge area of the main body 51. Both the welding part 52 and a through hole 516 are disposed in the second welding area 513, and are in a one-to-one correspondence with the pad 411 of the printed circuit board 40, so that the flexible printed circuit board 50 can be welded to the pad 411 of the printed circuit board 40 by using the welding part 52, to replace a connection between the flexible printed circuit board 50 and the printed circuit board 40 that is implemented by using a BTB connector, thereby reducing a thickness of an overall electronic device, especially of the mobile phone 100 such as a foldable phone.

The welding parts 52 may be arranged in a plurality of rows in the second welding area 513. Different metal wires 512 are correspondingly connected to different welding parts 52. For example, the welding part 52 may be a copper welding layer or a copper alloy welding layer. In this way, properties of copper or a copper alloy are utilized to implement welding of the flexible printed circuit board 50 to the pad 411 of the printed circuit board 40 by using the welding part 52, and lightening and thinning of the circuit board assembly are facilitated.

Figure 10:
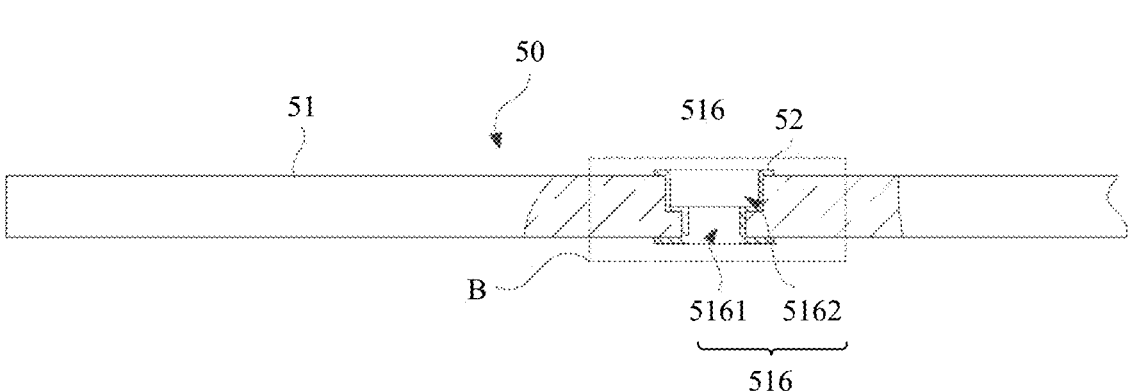
FIG. 10 is a partial sectional view of a flexible printed circuit board according to an embodiment of this application.
Figure 11:
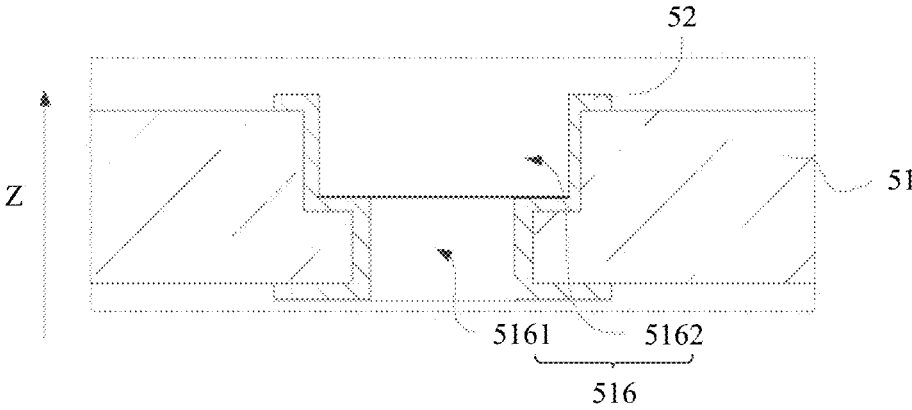

FIG. 10 is a partial sectional view of a flexible printed circuit board according to an embodiment of this application. FIG. 11 is an enlarged schematic view of Part B of the flexible printed circuit board in FIG. 10.

Referring to FIG. 10 and FIG. 11 in combination with FIG. 8 and FIG. 9, the through hole 516 that connects board surfaces of the flexible printed circuit board 50 is provided on the main body 51. Specifically, the through hole 516 may be opened at the flexible dielectric layer 511 of the main body 51. For example, the through hole 516 may be formed at the flexible dielectric layer 511 through laser ablation or mechanical drilling. A quantity of through holes 516 is equal to a quantity of welding parts 52.

Specifically: the welding part 52 is disposed on an inner wall of the through hole 516. The welding part 52 may be attached to the inner wall of the through hole 516. In this way, the welding part 52 can weld the flexible printed circuit board 50 to the printed circuit board 40 by using a welding piece 60, to form the circuit board assembly. For example, the welding part 52 may be formed on an inner wall of the through hole 516 through chemical deposition or the like. The welding part 52 is connected to the flexible dielectric layer 511 and a specific bonding force exists between the welding part 52 and the flexible dielectric layer 511.

The through hole 516 may include a recessing part 5162 and a connection segment 5161 that are sequentially connected in a board thickness direction (for example, a Z direction in FIG. 14) of the flexible printed circuit board 50. That is, the connection segment 5161 and the recessing part 5162 are sequentially disposed and mutually connected in a direction perpendicular to a board surface of the flexible printed circuit board 50. In this way, a radial dimension (that is, a pore size) of the through hole 516 can be increased by using the recessing part 5162, so that welding quality of the flexible printed circuit board 50 and the printed circuit board 40 can be easily determined by using a detection mechanism.

Figure 12:
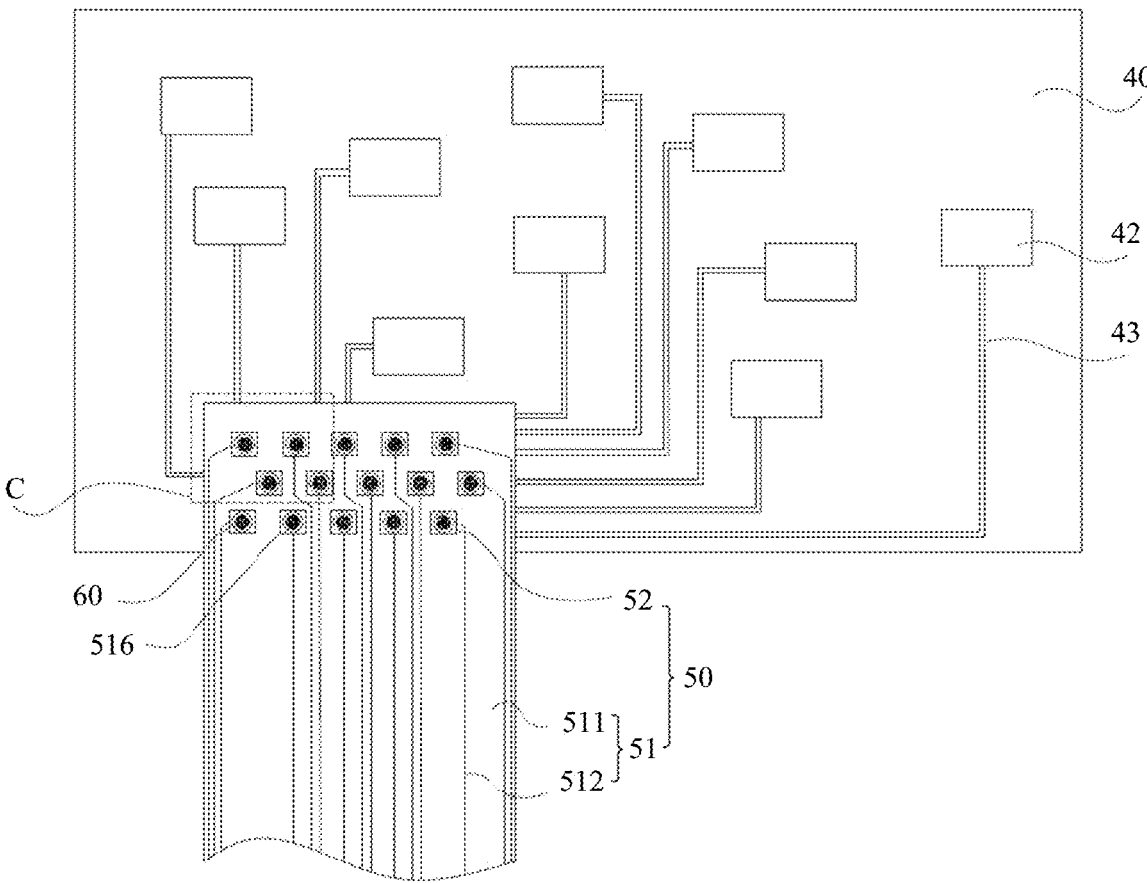
FIG. 12 is a schematic diagram of a structure of a circuit board assembly according to an embodiment of this application.
Figure 13:
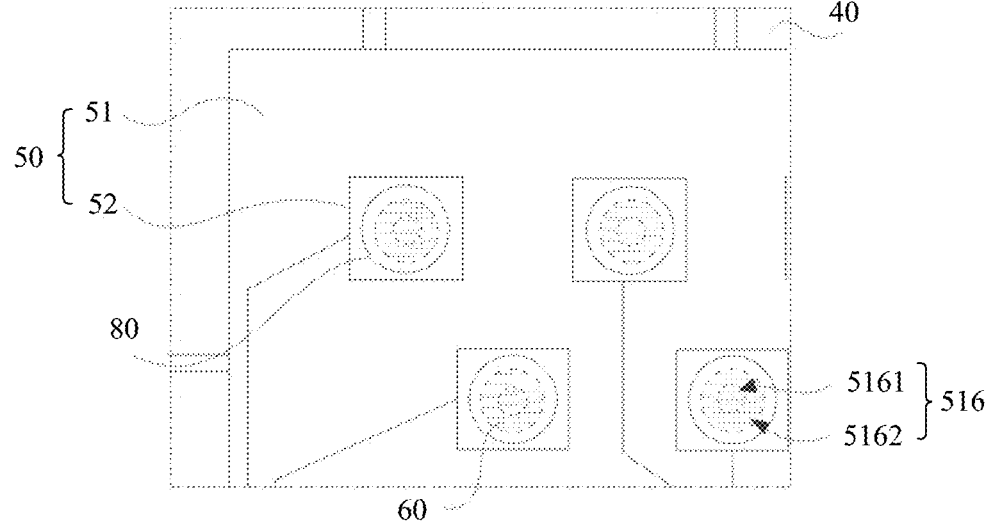
FIG. 13 is an enlarged schematic view of Part C of the circuit board assembly in FIG. 12.
Figure 14:
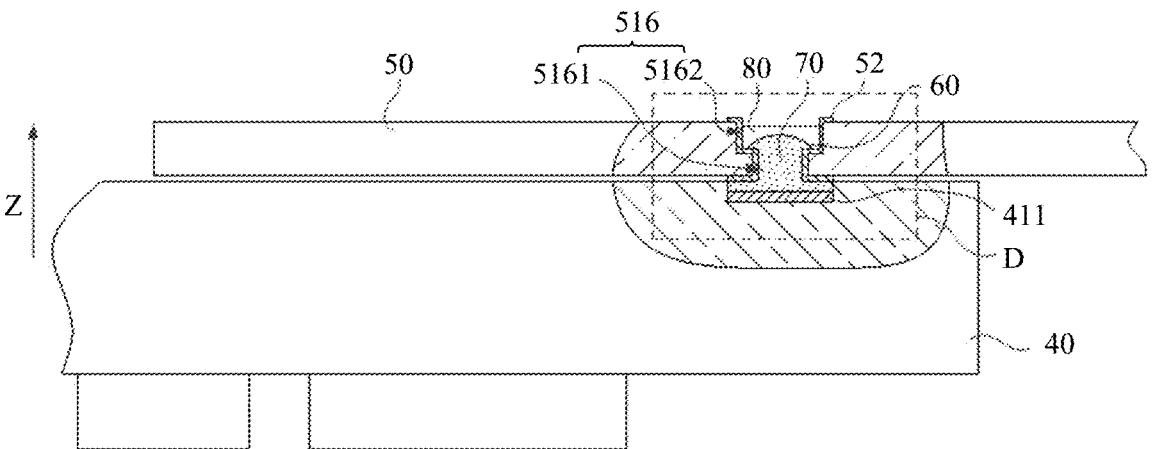
FIG. 14 is a partial sectional view of a circuit board assembly according to an embodiment of this application.
Figure 15:
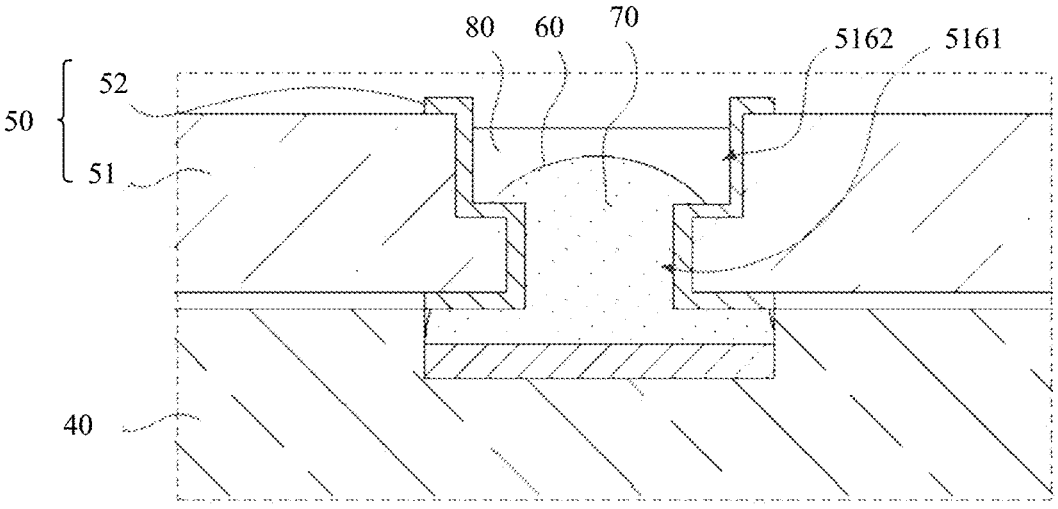
FIG. 15 is an enlarged schematic view of Part D of the circuit board assembly in FIG. 14.

FIG. 12 is a schematic diagram of a structure of a circuit board assembly according to an embodiment of this application. FIG. 13 is an enlarged schematic view of Part C of the circuit board assembly in FIG. 12. FIG. 14 is a partial sectional view of a circuit board assembly according to an embodiment of this application. FIG. 15 is an enlarged schematic view of Part D of the circuit board assembly in FIG. 14.

FIG. 12 to FIG. 15 include top views and partial sectional views of the circuit board assembly. As can be seen from FIG. 13 in combination with FIG. 14 and FIG. 15, the recessing part 5162 is disposed on a side that is of the connection segment 5161 and that is away from the pad 411, and the connection segment 5161 is connected to a bottom wall of the recessing part 5162. An end that is of the connection segment 5161 and that is away from the recessing part 5162 faces the pad 411, so that the welding piece 60 welded to the pad 411 overflows into the recessing part 5162 through the connection segment 5161, and welds the welding part 52 to the pad 411. In this way, because the through hole 516 is disposed, tin climbing of the welding piece 60) in a molten state in the through hole 516 in the Z direction (the board thickness direction of the flexible printed circuit board 50) can be increased, thereby improving welding strength of the flexible printed circuit board 50 and the printed circuit board 40.

In addition, the recessing part 5162 is disposed in the through hole 516 and at an end that is of the connection segment 5161 and that is away from the pad 411, in comparison with the original tin penetration hole 53 (as shown in FIG. 2) on the flexible printed circuit board 50a, an end that is of the through hole 516 and that is away from the pad 411 can have a larger radial dimension, an area (that is, a tin exposure area) of the welding piece 60 overflowing into the recessing part 5162 is relatively large, so that, without a need for the welding piece 60 in a molten state to overflow (that is, climb out of the through hole 516) to the outside of the through hole 516, tin exposure can be determined, and welding quality of the through hole 516 of the circuit board assembly can be determined. Therefore, the recessing part 5162 is disposed, so that welding quality of the flexible printed circuit board 50 and the printed circuit board 40 can be determined by a detection mechanism, so that a probability of a misjudgment of poor welding by the detection mechanism is reduced, accuracy of a welding detection result of the circuit board assembly can be improved, a path of exposure of the welding piece 60 on the flexible printed circuit board 50 can be effectively shortened, and welding difficulty and a risk of poor welding of the flexible printed circuit board 50 and the printed circuit board 40 can be reduced.

It should be noted that, after the welding piece 60 is solidified, the welding piece 60 forms a welding joint 70 shown in FIG. 14 and FIG. 15, so that the welding part 52 on the flexible printed circuit board 50 is connected to the corresponding pad 411 of the printed circuit board 40 by using the welding joint 70, and conduction is implemented.

For example, the welding piece 60 may be solder paste or another solder paste that can weld the flexible printed circuit board 50 to the printed circuit board 40. In this embodiment, the welding piece 60 is solder paste. The solder paste may include metal tin and soldering flux. In this way, the solder paste may be heated by using a laser or another method. After absorbing heat, the solder paste melts to a molten state. A part of the solder paste in a molten state may enter the connection segment 5161, and overflows along the connection segment up to the recessing part 5162. It should be noted that when the welding piece 60 is the solder paste, a path of exposure of the welding piece 60 on the flexible printed circuit board 50 may also be understood as a tin penetration path of the welding piece 60 on the flexible printed circuit board 50.

As shown in FIG. 15, two ends of the welding part 52 may extend outward in opposite directions along the inner wall of the through hole 516, and an end of the welding part 52 extends to a board surface of the main body 51. In this way, a contact area between the welding part 52 and the main body 51 can be increased, and a welding pin can be formed on the flexible printed circuit board 50, so that the welding part 52 can be easily welded to the pad 411, and strength of the welding joint 70 of the circuit board assembly can be improved.

In a related technology, referring to FIG. 1, when the pad 411a is welded to the welding part 52a by using the solder paste 61, a layer of soldering flux is further separately disposed in the tin penetration hole 53. In this way, a glass cover plate 90 is pressed on the tin penetration hole 53 of the flexible printed circuit board 50a, and the solder paste 61 is heated by using a laser or another method: and after the welding part 52a is welded to the pad 411a of the printed circuit board 40a by using the solder paste 61, a soldering flux layer 80a is formed by soldering flux covering an outer surface of the welding joint 70a, and is in contact with a glass cover plate 90a. Consequently, the glass cover plate 90a is contaminated.

Figure 16:
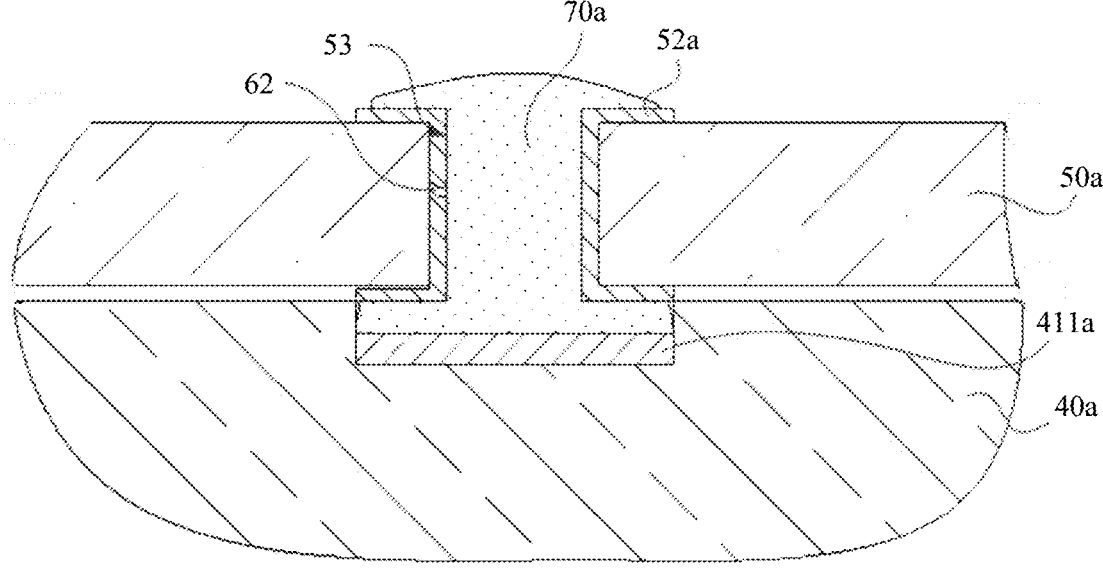
FIG. 16 is a schematic diagram of a structure of a failure of a welding joint in a circuit board assembly according to a related technology.

In addition, because there may be air in the solder paste 61 and the soldering flux layer 80a, in a process of welding, air entrapped in the solder paste 61 and the soldering flux layer 80a forms air bubbles, and the air bubbles escape along the tin penetration hole 53 to the outside of the circuit board assembly. FIG. 16 is a schematic diagram of a structure of a failure of a welding joint in a circuit board assembly according to a related technology. Referring to FIG. 16, a relatively long tin penetration path on the flexible printed circuit board 50a is not conducive for escape of air bubbles, and air bubbles may accumulate in the tin penetration hole 53. Consequently, welding quality of the welding joint 70a is reduced, and even a failure of the welding joint 70a is caused. For example, a fracture occurs on a fracture part 62 of the welding part 52a shown in FIG. 19.

Figure 17:
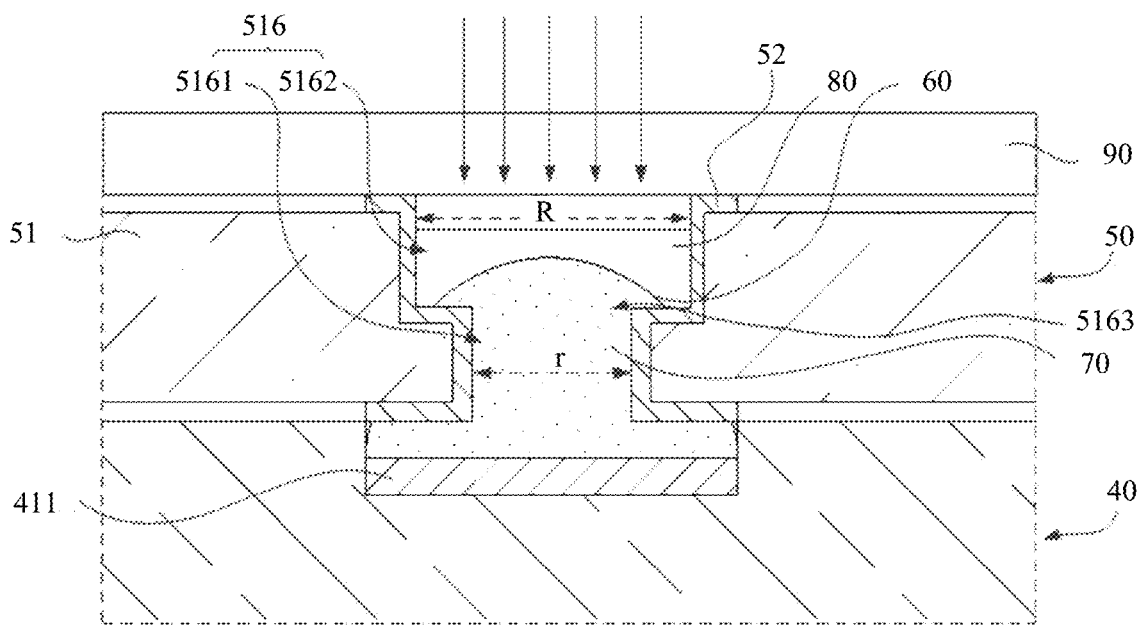
FIG. 17 is a schematic diagram of a welding state of a circuit board assembly according to an embodiment of this application.

FIG. 17 is a schematic diagram of a welding state of a circuit board assembly according to an embodiment of this application. Referring to FIG. 17, in this embodiment of this application, the recessing part 5162 is disposed, so that a soldering flux layer 80 may be disposed inside the recessing part 5162. In this case, soldering flux at the soldering flux layer 80 may be accommodated in the recessing part 5162. When the welding piece 60 is heated by using a laser or another method shown by an arrow in FIG. 20, and the welding part 52 is welded to the pad 411 of the printed circuit board 40 by using the welding piece 60, contact between the soldering flux and the glass cover plate 90 in a process of welding can be reduced or avoided, so that contamination of the glass cover plate 90 by the soldering flux in the process of welding is effectively reduced or even avoided. In addition, use of the recessing part 5162 effectively shortens a path of exposure of the welding piece 60 on the flexible printed circuit board 50, reduces welding difficulty of the flexible printed circuit board 50 and the printed circuit board 40, and enables air bubbles in the welding piece 60 and the soldering flux to easily escape to the outside of the circuit board through the through hole 516, so that less air bubbles accumulate in the through hole 516, thereby further improving welding quality of the welding joint 70 of the circuit board assembly.

To facilitate a connection between the recessing part 5162 to the connection segment 5161, a side that is of the recessing part 5162 and that is away from the connection segment 5161 is an open end 5163. In this way, after entering the connection segment 5161, the welding piece 60 in a molten state can continue to rise along the connection segment 5161 and overflow into the recessing part 5162 by using the open end 5163, to implement tin exposure on the flexible printed circuit board 50, so that welding quality of the flexible printed circuit board 50 and the printed circuit board 40 can be easily determined by a detection mechanism.

It can be seen from FIG. 17 that a radial dimension of an open edge of the recessing part 5162 is greater than an inner diameter of the connection segment 5161. In this way, a radial dimension of the recessing part 5162 can be greater than a dimension of the connection segment 5161. On the basis that the welding part 52 is welded to the pad 411, welding quality of the flexible printed circuit board 50 and the printed circuit board 40 can be easily determined, a misjudgment of poor welding of the welding joint 70 of the circuit board assembly by the detection mechanism can reduced, a risk of poor welding of the welding joint 70 of the circuit board assembly can be reduced, and accuracy of a welding detection result of the circuit board assembly can be improved. In addition, the recessing part 5162 is disposed, so that a path of exposure of the welding piece 60 on the flexible printed circuit board 50 can be effectively shortened, and welding difficulty of the flexible printed circuit board 50 and the printed circuit board 40) can be reduced.

As shown in FIG. 17, a minimum radial dimension R of the recessing part 5162 is greater than or equal to twice an inner diameter r of the connection segment 5161. That is, a ratio of the minimum radial dimension R of the recessing part 5162 to the inner diameter r of the connection segment 5161 is at least 2:1. For example, the ratio of the minimum radial dimension R of the recessing part 5162 to the inner diameter r of the connection segment 5161 may be 2.5:1, 3:1, 4:1, or the like. In this way, when a total volume of the welding piece 60 on the pad 411 remains unchanged, by increasing the radial dimension of the recessing part 5162, a capacity of the recessing part 5162 for the welding piece 60 can be increased, so that welding quality of the welding joint 70 of the circuit board assembly can be easily determined, a path (that is, a tin penetration path) of exposure of the welding piece 60 on the flexible printed circuit board 50 can be shortened as much as possible while it is determined whether the welding joint 70 of the circuit board assembly is good, difficulty of welding of the welding joint 70 of the circuit board assembly is further reduced, accuracy of a welding detection result of the circuit board assembly can be improved, and air bubbles in the welding piece 60 and the soldering flux can easily escape through the through hole 516, to further improve welding quality of the welding joint 70 of the circuit board assembly.

Correspondingly: the welding part 52 also has a through hole matching a structure of the through hole 516. It should be understood that, when a structural size of the welding part 52 remains unchanged, if the radial dimension of the recessing part 5162 gradually increases, a part of the through hole in the welding part 52 may be missing, and a structure of the through hole is incomplete. This may affect welding quality of the welding joint 70 of the circuit board assembly.

To ensure completeness of the through hole in the welding part 52, a distance between a circumferential edge of the recessing part 5162 and an edge of the pad 411 is less than or equal to 0.05 mm. In this way, a specific one-side margin can be reserved between the through hole 516 and the welding part 52, thereby ensuring completeness of the through hole in the welding part 52.

In a possible implementation, as shown in FIG. 17, the recessing part 5162 may have a same radial dimension in a board thickness direction perpendicular to the flexible printed circuit board 50; that is, radial dimensions of segments of the recessing part 5162 are the same. An inner wall of the recessing part 5162 may be a vertical surface perpendicular to a board surface of the flexible printed circuit board 50.

Figure 18:
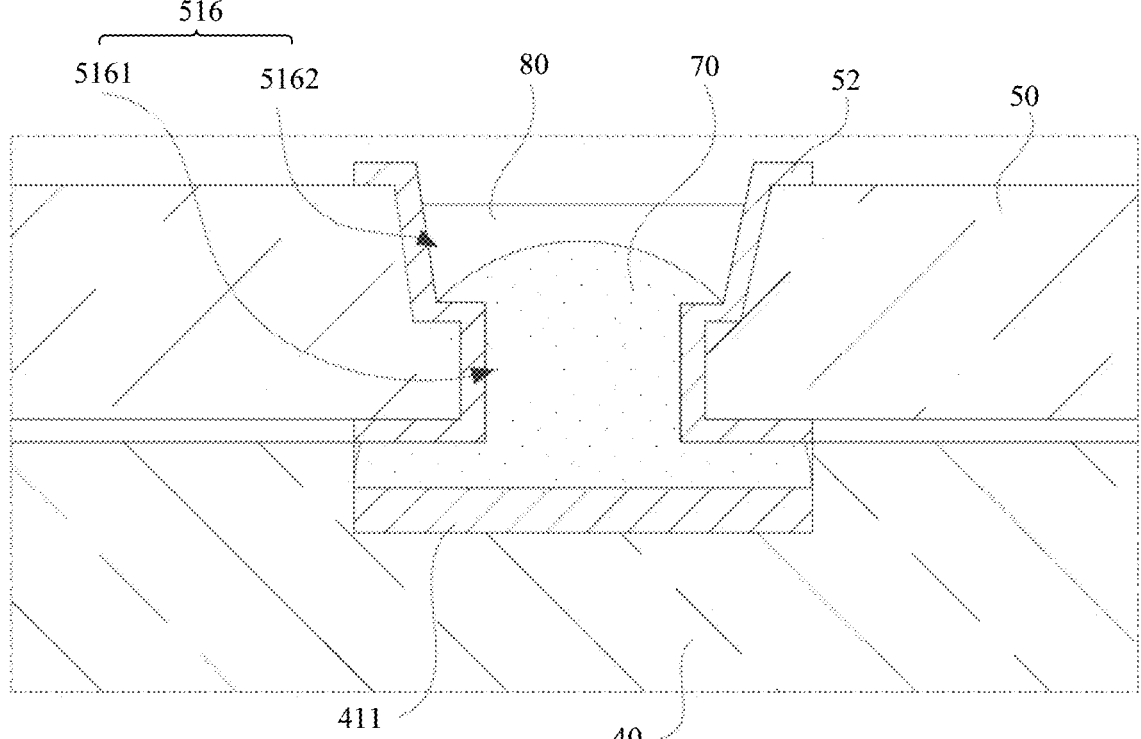
FIG. 18 is an enlarged schematic view of Part D of another circuit board assembly according to an embodiment of this application.

FIG. 18 is an enlarged schematic view of Part D of another circuit board assembly according to an embodiment of this application. FIG. 18 shows another structure of the recessing part 5162. Referring to FIG. 18, in another possible implementation, the recessing part 5162 may also have different radial dimensions in a board thickness direction perpendicular to the flexible printed circuit board 50. That is, radial dimensions of segments of the recessing part 5162 are different. An inner wall of the recessing part 5162 may be an inclined surface that intersects a board surface of the flexible printed circuit board 50. In this case, an inner wall of the recessing part 5162 may be a tapered surface. In this way, accuracy of a welding detection result of the circuit board assembly can be improved, and structures of the through hole 516 and the flexible printed circuit board 50 can be more diversified.

In this embodiment, the recessing part 5162 uses a same radial dimension in the board thickness direction perpendicular to the flexible printed circuit board 50. In this way, on the basis that a path of exposure of the welding piece 60 on the flexible printed circuit board 50 is shortened, on the one hand, an excessively large hole opened at the recessing part 5162 may not exist in the main body 51 and the welding part 52, and on the other hand, the recessing part 5162 can be easily processed. For example, the recessing part 5162 includes, but is not limited to, a groove, a through hole, or another structure that is on the main body 51 and that is connected to the connection segment 5161. In this embodiment, structures of the recessing part 5162 and the connection segment 5161 on a board surface of the flexible printed circuit board 50 may include, but is not limited to, a circular hole, a square hole, an oval hole, or the like.

Figure 19:
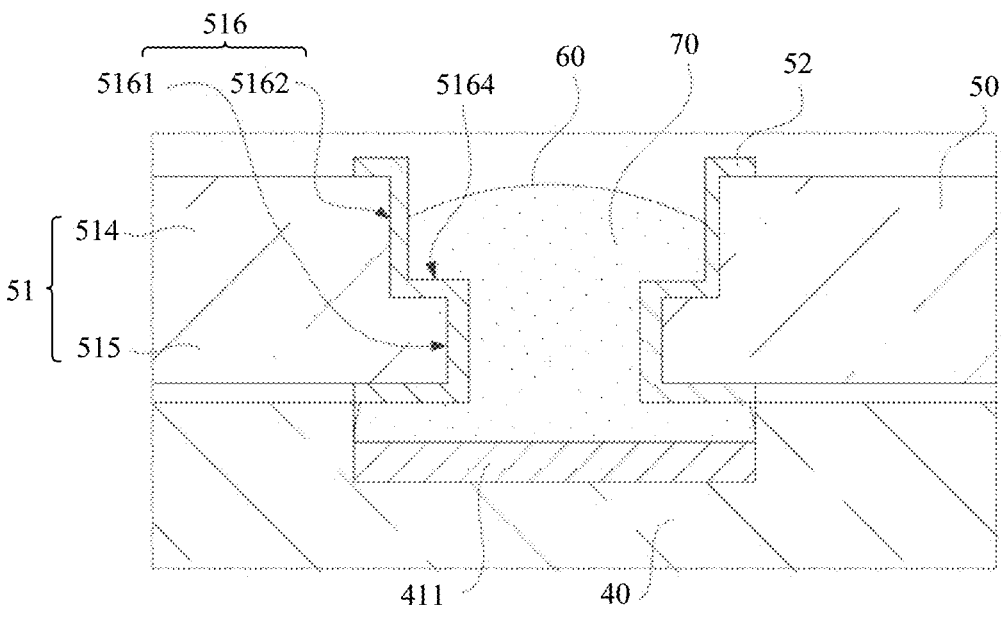
FIG. 19 is a schematic diagram of a welding state of another circuit board assembly according to an embodiment of this application.

FIG. 19 is a schematic diagram of a welding state of another circuit board assembly according to an embodiment of this application.

In a possible implementation, as shown in FIG. 19, the recessing part 5162 and the connection segment 5161 in this embodiment may be coaxially disposed. In this way: a path of exposure of the welding piece 60 on the flexible printed circuit board 50 can be further reduced, so that air bubbles in the welding piece 60 can quickly escape to the outside of the circuit board assembly through the through hole 516 while the welding piece 60 in a molten state can overflow into the recessing part 5162 through the connection segment 5161, accumulation of air bubbles in the through hole 516 is reduced as much as possible, and welding strength of the welding joint 70) of the circuit board assembly is further improved. In addition, a structure of the through hole 516 can be simplified, thereby facilitating opening of the through hole 516 on the main body 51.

Alternatively, in another possible implementation, referring to FIG. 19, the recessing part 5162 and the connection segment 5161 in this embodiment may be eccentrically (that is, non-coaxially) disposed. In this way, accuracy of a welding detection result of the circuit board assembly can be improved, and a structure of the through hole 516 can be more diversified.

In the following embodiment, the electronic device in this embodiment of this application is further described by using an example in which the recessing part 5162 and the connection segment 5161 are coaxially disposed.

At least a part of an inner wall of the recessing part 5162 forms an exposure surface 5164 to expose the welding piece 60, and the exposure surface 5164 is disposed on an outer side of a peripheral edge of an end of the connection segment 5161. For example, an inner bottom wall of the recessing part 5162 may form the exposure surface 5164 to expose the welding piece 60. In this way, the welding piece 60 in a molten state only needs to climb out of the connection segment 5161 to overflow to the exposure surface 5164, so that welding quality of the flexible printed circuit board 50 and the printed circuit board 40 can be determined, a misjudgment of poor welding of the flexible printed circuit board 50 and the printed circuit board 40 can be effectively reduced, accuracy of a welding detection result of the circuit board assembly can be improved, welding difficulty of the flexible printed circuit board 50 and the printed circuit board 40) can be reduced, and a total thickness of the circuit board assembly can be reduced.

As shown in FIG. 19, the welding piece 60 in a molten state may overflow into the recessing part 5162 through the connection segment 5161 and the exposure surface 5164. When the welding piece 60 in the recessing part 5162 reaches a specific volume, for example, when an overflow height of the welding piece 60 in the recessing part 5162 is greater than or equal to half of a recessing depth of the recessing part 5162, a specific compressive stress can be added to the welding part 52 by using the welding piece 60, so that a bonding force between the welding part 52 and the main body 51 and strength of the welding joint 70 in the circuit board assembly can be improved.

Figure 20:
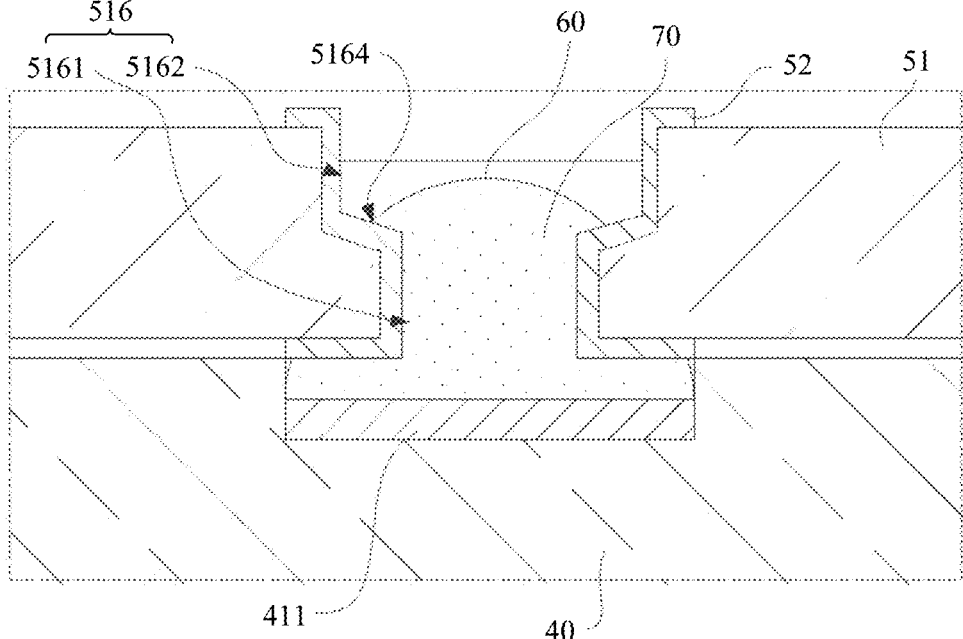
FIG. 20 is an enlarged schematic view of Part D of another circuit board assembly according to an embodiment of this application.

FIG. 20 is an enlarged schematic view of Part D of another circuit board assembly according to an embodiment of this application.

In a possible implementation, as shown in FIG. 19, the exposure surface 5164 may be parallel to a board surface of the flexible printed circuit board 50. Alternatively, in another possible implementation, as shown in FIG. 20, the exposure surface 5164 may be obliquely disposed on a board surface of the flexible printed circuit board 50. In this way, accuracy of a welding detection result of the circuit board assembly can be improved, a path of exposure of the welding piece 60 on the flexible printed circuit board 50 is shortened, and structures of the through hole 516 and the flexible printed circuit board 50 can be more diversified.

It should be noted that in this embodiment, the exposure surface 5164 is parallel to a board surface of the flexible printed circuit board 50. In comparison with that the exposure surface 5164 is obliquely disposed on a board surface of the flexible printed circuit board 50, in this way, the welding piece 60 can easily overflow into the recessing part 5162 for being exposed on the exposure surface 5164, and structures of the recessing part 5162 and the through hole 516 can also be simplified.

For example, in this embodiment, the through hole 516 may be, but is not limited to, stepped holes shown in FIG. 19 and FIG. 20. An end of a larger diameter of the stepped hole may form the recessing part 5162, an end of a smaller diameter of the stepped hole may form the connection segment 5161, and a stepped surface of the stepped hole may form the exposure surface 5164. That is, the through hole 516 is a stepped hole in which an upper part is larger than a lower part. In this way, the stepped hole is disposed, so that on the one hand, a path (that is, a tin penetration path) of exposure of the welding piece 60 on the flexible printed circuit board 50 can be shortened, and the welding joint 70 of the circuit board assembly can be easily welded, welding quality of the welding joint 70 of the circuit board assembly by a detection mechanism can be easily determined, and accuracy of a welding detection result of the circuit board assembly can be improved: on the other hand, a contact area between the welding part 52 and the main body 51 of the flexible printed circuit board 50 can be increased, and welding strength of the welding joint 70 of the circuit board assembly can be improved.

In this embodiment of this application, an electrical connection between the flexible printed circuit board 50 and the printed circuit board 40 in the electronic device is implemented, and the recessing part 5162 of the through hole 516 in the flexible printed circuit board 50 is disposed, so that a path of exposure of the welding piece 60 on the flexible printed circuit board 50 can be shortened, welding difficulty and a risk of poor welding of the flexible printed circuit board 50 and the printed circuit board 40 can be reduced, and lightening and thinning of the electronic device are facilitated while stability of the circuit board assembly is ensured.

FIG. 21 is a schematic flowchart of a method for manufacturing a circuit board assembly according to an embodiment of this application.

Based on the foregoing description, an embodiment of this application further provides a method for manufacturing a circuit board assembly. The manufacturing method is applied to the circuit board assembly according to any one of the foregoing implementations.

Referring to FIG. 21 in combination with FIG. 19, the manufacturing method may include the following steps:

Step S01: Open a through hole on a main body of a flexible printed circuit board, where the through hole includes a recessing part and a connection segment that are sequentially connected in a board thickness direction of the flexible printed circuit board, and the connection segment is connected to a bottom wall of the recessing part.

It should be noted that after a through hole 516 including a recessing part 5162 is disposed, on the basis that welding strength of a flexible printed circuit board 50 and a printed circuit board 40 is improved, a radial dimension of the recessing part 5162 of the through hole 516 can be increased, so that a welding piece 60 does not need to climb out of the through hole 516, and an exposure state of the welding piece 60 in the recessing part 5162 can be detected by a detection mechanism, so as to determine a welding state of the through hole 516 of the circuit board assembly. Therefore, a misjudgment of poor welding of the through hole 516 of the circuit board assembly by the detection mechanism is reduced, and accuracy of a welding detection result of the circuit board assembly can be improved. In addition, the recessing part 5162 is disposed, so that a path of exposure of the welding piece 60 on the flexible printed circuit board 50 can be shortened, welding difficulty and a risk of poor welding of the flexible printed circuit board 50 and the printed circuit board 40 can be reduced, and lightening and thinning of the circuit board assembly are facilitated.

The through hole 516 may be opened on a main body 51 of the flexible printed circuit board 50 through laser ablation or mechanical drilling. In this embodiment, an opening manner of the through hole 516 is not further limited. For structures of the through hole 516, the flexible printed circuit board 50, and the printed circuit board 40, refer to related descriptions in the foregoing descriptions. Details are not further described in this embodiment.

FIG. 22 is a schematic flowchart of a method for opening a through hole on a flexible printed circuit board according to an embodiment of this application.

In a possible implementation, referring to FIG. 22 in combination with FIG. 19, the opening a through hole on a main body of a flexible printed circuit board may specifically include:

Step S11: Open the connection segment on a side that is of the main body and that faces the printed circuit board.

Step S12: Open the recessing part on a side that is of the main body and that is opposite to the connection segment, where the recessing part is disposed opposite to the connection segment.

It should be noted that, when the recessing part 5162 is opened, the main body 51 may be turned over, and a position, a size, a structure, and the like of a connection segment 5161 may be calibrated on the main body 51, so that when the recessing part 5162 is opened on a side that is of the main body 51 and that is opposite to the connection segment 5161, it may be ensured that the recessing part 5162 is disposed opposite to the connection segment 5161. In this embodiment, when the through hole 516 is opened by using the method shown in FIG. 22, a process of opening the through hole 516 on the flexible printed circuit board 50 can be simplified while it is ensured that the through hole 516 is formed on the flexible printed circuit board 50.

It should be understood that, in actual application, the connection segment 5161 may be first opened on the main body 51 of the flexible printed circuit board 50, and then the recessing part 5162 is opened. In this embodiment, an opening sequence of the connection segment 5161 and the recessing part 5162 on the main body 51 is not further limited.

Figure 23:
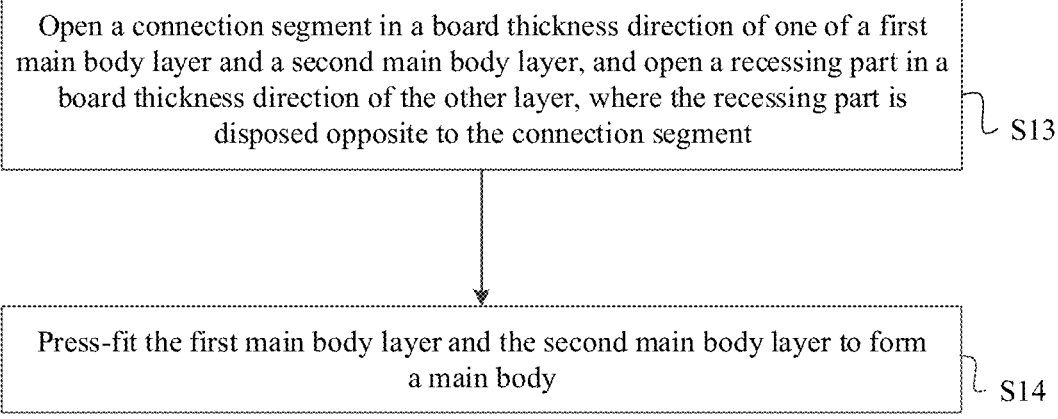
FIG. 23 is a schematic flowchart of another method for opening a through hole on a flexible printed circuit board according to an embodiment of this application.

FIG. 23 is a schematic flowchart of another method for opening a through hole on a flexible printed circuit board according to an embodiment of this application.

Alternatively, in another possible implementation, refer- ring to FIG. 23 in combination with FIG. 19, opening the through hole 516 on the main body 51 of the flexible printed circuit board 50 may specifically include:

Step S13: Open the connection segment in a board thickness direction of one of a first main body layer and a second main body layer, and open the recessing part in a board thickness direction of the other layer, where the recessing part is disposed opposite to the connec- tion segment.

Step S14: Press-fit the first main body layer and the second main body layer to form the main body.

It should be noted that, when the through hole 516 is opened by using the method shown in FIG. 23, the connec- tion segment 5161 and the recessing part 5162 may be simultaneously opened. In this way, formation of the through hole 516 on the flexible printed circuit board 50 is facilitated, difficulty of opening the through hole 516 on the flexible printed circuit board 50 can be reduced, and opening efficiency of the through hole 516 can be improved.

Step S02: Dispose a welding part of the flexible printed circuit board on an inner wall of the through hole.

It should be noted that a welding part 52 may be formed on an inner wall of the through hole 516 through chemical deposition or the like. In this way, the welding part 52 is disposed on the inner wall of the through hole 516, so that the welding part 52 can be connected to the main body 51 and a specific bonding force exists between the welding part 52 and the main body 51, to prevent the welding part 52 from being separated from the main body 51 under action of an external force, so as to avoid affecting welding quality of the welding joint 70 of the circuit board assembly.

Step S03: Attach and align the through hole and a pad that is provided with a welding piece and that is of a printed circuit board.

It should be noted that before the through hole 516 and a pad 411 are attached and aligned, the welding piece 60 first needs to be printed on the pad 411 are attached and aligned, so that after the flexible printed circuit board 50 and the pad 411, the welding piece 60 can overflow into the recessing part 5162 through the connection segment 5161.

Step S04: Melt the welding piece, so that the welding piece in a molten state overflows into the recessing part through the connection segment, and welds the welding part to the pad.

It should be noted that before the welding piece 60 is melted, a glass cover plate 90 or another transparent struc- ture needs to be pressed on the welding part 52 of the flexible printed circuit board 50, so that when the welding piece 60 is heated and melted by using a laser or another method, a part of the welding piece 60 may enter the connection segment 5161 under a pressing action of the flexible printed circuit board 50 and the glass cover plate 90, and overflow into the recessing part 5162 through the connection segment 5161, and form a welding joint 70 in the through hole 516 after the welding piece 60 is solidified: and the welding part 52 is welded to the pad 411 by using the welding joint 70.

In this embodiment of this application, the through hole 516 including the recessing part 5162 is disposed on the flexible printed circuit board 50, the recessing part 5162 is connected to the connection segment 5161 of the through hole 516, and is disposed on a side that is of the connection segment 5161 and that is away from the pad 411 of the printed circuit board 40. In this way, when an end that is of the connection segment 5161 and that is away from the recessing part 5162 faces the pad 411, the welding piece 60 in a molten state on the pad 411 overflows into the recessing part 5162 through the connection segment 5161, and welds the welding part 52 to the pad 411 by using the welding piece 60. In this embodiment of this application, accuracy of a welding detection result of the circuit board assembly can be improved, a path of exposure of the welding piece 60 on the flexible printed circuit board 50 can be shortened, and welding difficulty and a risk of poor welding of the flexible printed circuit board 50) and the printed circuit board 40 can be reduced.

In the descriptions of embodiments of this application, it should be noted that unless otherwise specified and defined explicitly, the terms "mount". "connected to" and "connect" should be understood in a broad sense, and for example, may be a fixed connection or an indirect connection by using an intermediate medium, or may be internal communication between two elements or an interaction relationship of two elements. A person of ordinary skill in the art can understand specific meanings of these terms in embodiments of this application based on specific situations.

In the specification of embodiments, claims, and accom- panying drawings of this application, the terms "first". "second". "third". "fourth", and the like (if existent) are intended to distinguish between similar objects but do not necessarily indicate a specific order or sequence.

What is claimed is:

1. A circuit board assembly, comprising a flexible printed circuit board and a printed circuit board, wherein a pad for disposing a welding piece is provided on the printed circuit board;

the flexible printed circuit board comprises a main body including a flexible dielectric layer and a plurality of metal wires disposed on the flexible dielectric layer, a welding part, and a through hole that extends through the flexible dielectric layer of the main body and that connects board surfaces of the flexible printed circuit board is provided on the main body, and the welding part is disposed on an inner wall of the through hole;

the through hole comprises a recessing part and a con- nection segment that are sequentially connected in a board thickness direction of the flexible printed circuit board, the recessing part is located in the main body and is disposed on a side that is of the connection segment and that is away from the pad, and the con- nection segment is located in the main body and is connected to a bottom wall of the recessing part; and an end that is of the connection segment and that is away from the recessing part faces the pad, so that the welding piece welded to the pad overflows into the recessing part through the connection segment, and welds the welding part to the pad;

wherein the pad is recessed within a bottom portion of a cavity of the printed circuit board and the welding piece enters a top portion of the cavity to weld the welding part to the pad;

wherein a side that is of the recessing part and that is away from the connection segment is an open end, and a radial dimension of an open edge of the recessing part is greater than an inner diameter of the connection segment; and wherein at least a part of an inner wall of the recessing part forms an exposure surface to expose the welding piece, and the exposure surface is disposed on an outer side of a peripheral edge of an end of the connection segment.

2. The circuit board assembly according to claim 1, wherein the exposure surface is parallel to a board surface of the flexible printed circuit board; or the exposure surface is obliquely disposed on a board surface of the flexible printed circuit board.

3. The circuit board assembly according to claim 2, wherein the through hole is a stepped hole, an end of a larger diameter of the stepped hole forms the recessing part, an end of a smaller diameter of the stepped hole forms the connection segment, and a stepped surface of the stepped hole forms the exposure surface.

4. The circuit board assembly of claim 1, wherein the welding piece in a molten state may overflow into the recessing part through the connection segment and the exposure surface; and an overflow height of the welding piece in the recessing part is greater than or equal to half of a recessing depth of the recessing part.

5. The circuit board assembly according to claim 1, wherein a minimum radial dimension of the recessing part is greater than or equal to twice an inner diameter of the connection segment.

6. The circuit board assembly of claim 5, wherein a distance between a circumferential edge of the recessing part and an edge of the pad is less than or equal to 0.05 mm.

7. The circuit board assembly of claim 1, wherein the recessing part has different radial dimensions in a board thickness direction perpendicular to the flexible printed circuit board.

8. The circuit board assembly according to claim 1, wherein the recessing part and the connection segment are coaxially disposed.

9. The circuit board assembly according to claim 1, wherein the welding part is attached to the inner wall of the through hole.

10. The circuit board assembly according to claim 9, wherein two ends of the welding part extend outward in opposite directions along the inner wall of the through hole, and an end of the welding part extends to a board surface of the main body.

11. The circuit board assembly according to claim 9, wherein the welding part is a copper welding layer or a copper alloy welding layer.

12. The circuit board assembly according to claim 1, wherein the welding piece is solder paste.

13. An electronic device, comprising:

a circuit board assembly comprising a flexible printed circuit board and a printed circuit board, wherein a pad for disposing a welding piece is provided on the printed circuit board;

the flexible printed circuit board comprises a main body including a flexible dielectric layer and a plurality of metal wires disposed on the flexible dielectric layer, and a welding part, a through hole that is formed in the flexible dielectric layer of the main body and that connects board surfaces of the flexible printed circuit board is provided on the main body, and the welding part is disposed on an inner wall of the through hole;

the through hole comprises a recessing part and a connection segment that are sequentially connected in a board thickness direction of the flexible printed circuit board, the recessing part is located in the main body and is disposed on a side that is of the connection segment and that is away from the pad, and the connection segment is located in the main body and is connected to a bottom wall of the recessing part; and an end that is of the connection segment and that is away from the recessing part faces the pad, so that the welding piece welded to the pad overflows into the recessing part through the connection segment, and welds the welding part to the pad;

wherein the pad is recessed within a bottom portion of a cavity of the printed circuit board, and the welding piece enters a top portion of the cavity to weld the welding part to the pad;

wherein a side that is of the recessing part and that is away from the connection segment is an open end, and a radial dimension of an open edge of the recessing part is greater than an inner diameter of the connection segment; and wherein at least a part of an inner wall of the recessing part forms an exposure surface to expose the welding piece, and the exposure surface is disposed on an outer side of a peripheral edge of an end of the connection segment.

14. The electronic device according to claim 13, wherein the exposure surface is parallel to a board surface of the flexible printed circuit board; or the exposure surface is obliquely disposed on a board surface of the flexible printed circuit board.

15. The electronic device according to claim 14, wherein the through hole is a stepped hole, an end of a larger diameter of the stepped hole forms the recessing part, an end of a smaller diameter of the stepped hole forms the connection segment, and a stepped surface of the stepped hole forms the exposure surface.

16. The electronic device of claim 13, wherein the welding piece in a molten state may overflow into the recessing part through the connection segment and the exposure surface; and an overflow height of the welding piece in the recessing part is greater than or equal to half of a recessing depth of the recessing part.

17. The electronic device according to claim 13, wherein a minimum radial dimension of the recessing part is greater than or equal to twice an inner diameter of the connection segment.

18. The electronic device according to claim 17, wherein a distance between a circumferential edge of the recessing part and an edge of the pad is less than or equal to 0.05 mm.

19. The electronic device according to claim 13, wherein the recessing part has different radial dimensions in a board thickness direction perpendicular to the flexible printed circuit board.

* * * * *